United States Patent
Higashikawa et al.

(10) Patent No.: US 10,516,066 B2
(45) Date of Patent: Dec. 24, 2019

(54) PHOTOVOLTAIC CONVERSION DEVICE, PHOTOVOLTAIC MODULE, AND SOLAR POWER GENERATION SYSTEM

(71) Applicant: SHARP KABUSHIKI KAISHA, Sakai, Osaka (JP)

(72) Inventors: Makoto Higashikawa, Sakai (JP); Toshihiko Sakai, Sakai (JP); Kazuya Tsujino, Sakai (JP); Liumin Zou, Sakai (JP); Teruaki Higo, Sakai (JP); Yuta Matsumoto, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/087,599

(22) PCT Filed: Mar. 17, 2017

(86) PCT No.: PCT/JP2017/010841
§ 371 (c)(1),
(2) Date: Sep. 21, 2018

(87) PCT Pub. No.: WO2017/164099
PCT Pub. Date: Sep. 28, 2017

(65) Prior Publication Data
US 2019/0103499 A1    Apr. 4, 2019

(30) Foreign Application Priority Data
Mar. 23, 2016  (JP) .................... 2016-057981

(51) Int. Cl.
*H01L 31/0216*    (2014.01)
*H01L 31/047*    (2014.01)
(Continued)

(52) U.S. Cl.
CPC .. *H01L 31/02167* (2013.01); *H01L 31/02013* (2013.01); *H01L 31/02245* (2013.01);
(Continued)

(58) Field of Classification Search
CPC ....... H01L 31/022441; H01L 31/02245; H01L 31/022458; H01L 31/022425;
(Continued)

(56) References Cited

U.S. PATENT DOCUMENTS 8,525,018 B2 * 9/2013 Ji .................. H01L 31/02167
136/255
8,633,379 B2 * 1/2014 Ji .................. H01L 31/0682
136/252
(Continued)

FOREIGN PATENT DOCUMENTS

JP       5270658 B2    8/2013
WO    2016/208219 A1    12/2016

*Primary Examiner* — Golam Mowla
(74) *Attorney, Agent, or Firm* — ScienBiziP, P.C.

(57) ABSTRACT

A photovoltaic conversion device (10) includes a semiconductor substrate (1), a passivation film (3), n-type amorphous semiconductor strips, p-type amorphous semiconductor strips (5p), and electrodes (7). The passivation film (3) is formed on one of the surfaces of the semiconductor substrate (1). The n- and p-type amorphous semiconductor strips are arranged alternately as viewed along an in-plane direction of the semiconductor substrate (1) (Y-axis direction). The p-type amorphous semiconductor strips (5p) have reduced-thickness regions (51) at some intervals as viewed along the length direction of the p-type amorphous semiconductor strips (5p) (X-axis direction). The n-type amorphous semiconductor strips have a similar structure. The electrodes (7) are provided on the p-type amorphous semiconductor strips (5p), but not in areas where the reduced-thickness regions (51) have a positive curvature r with respect to the length
(Continued)

direction of the reduced-thickness regions (51). Electrodes on the n-type amorphous semiconductor strips have a similar arrangement.

8 Claims, 18 Drawing Sheets

(51) Int. Cl.
*H01L 31/0224* (2006.01)
*H01L 31/05* (2014.01)
*H01L 31/02* (2006.01)

(52) U.S. Cl.
CPC ............. *H01L 31/022425* (2013.01); *H01L 31/022441* (2013.01); *H01L 31/022458* (2013.01); *H01L 31/047* (2014.12); *H01L 31/0516* (2013.01)

(58) Field of Classification Search
CPC . H01L 31/0224; H01L 31/0516; H01L 31/05; H01L 31/0747; H01L 31/02013; H01L 31/02167; H01L 31/02168; H01L 31/047
See application file for complete search history.

(56) References Cited

U.S. PATENT DOCUMENTS

| | | | |
|---|---|---|---|
| 8,664,034 B2* | 3/2014 | Takahama | H01L 31/022441 257/E31.003 |
| 8,946,547 B2* | 2/2015 | Moslehi | H01L 31/022441 136/259 |
| 8,962,380 B2* | 2/2015 | Moslehi | H01L 31/035281 438/98 |
| 9,293,614 B2* | 3/2016 | Oh | H01L 31/03529 |
| 9,929,294 B2* | 3/2018 | Tokioka | H01L 31/02167 |
| 2010/0032014 A1 | 2/2010 | Bettinelli et al. | |
| 2010/0200058 A1* | 8/2010 | Funakoshi | H01L 31/0516 136/256 |
| 2011/0000532 A1* | 1/2011 | Niira | H01L 31/0747 136/255 |
| 2011/0089420 A1* | 4/2011 | Prabhakar | H01L 31/1804 257/53 |
| 2015/0155828 A1* | 6/2015 | Nam | H02S 50/10 324/761.01 |
| 2018/0190840 A1 | 7/2018 | Harada et al. | |

* cited by examiner (a)

(b)

(a)

(b)

(c)

(d)

(k)

(l)

10

(m)

PHOTOVOLTAIC CONVERSION DEVICE, PHOTOVOLTAIC MODULE, AND SOLAR POWER GENERATION SYSTEM

TECHNICAL FIELD

The present invention relates to photovoltaic conversion devices, photovoltaic modules, and solar power generation systems.

BACKGROUND ART

Japanese Patent No. 5270658 discloses a backside-electrode-based solar cell including a monocrystalline silicon substrate having formed on the backside thereof heterojunctions including alternately arranged n- and p-type amorphous semiconductor strips so as to form an interdigitated structure. Electrodes are formed on the n- and p-type amorphous semiconductor strips. This backside-electrode-based solar cell further includes non-interconnected amorphous semiconductor strips. Electrodes are formed also in the spaces that separate these amorphous semiconductor strips.

SUMMARY OF INVENTION

The backside-electrode-based solar cell described in Japanese Patent No. 5270658 includes amorphous semiconductor strips that are separated by spaces in which electrodes are also provided.

In these spaces, however, the carriers generated in crystals cannot be collected. Because the spaces are also connected to electrodes, the properties of photovoltaic conversion devices deteriorate, which is an issue.

In view of this situation, the present invention, in an embodiment thereof, provides a photovoltaic conversion device with good properties.

The present invention, in another embodiment thereof, provides a photovoltaic module including photovoltaic conversion devices with good properties.

The present invention, in a further embodiment thereof, provides a solar power generation system including photovoltaic conversion devices with good properties.

The present invention, in an embodiment thereof, is directed to a photovoltaic conversion device including a semiconductor substrate, a first amorphous semiconductor section, a second amorphous semiconductor section, a plurality of first electrodes, and a plurality of second electrodes. The semiconductor substrate is of a first conductivity type. The first amorphous semiconductor section is provided on one of faces of the semiconductor substrate and includes at least one first amorphous semiconductor strip of the first conductivity type. The second amorphous semiconductor section is provided on one of the faces of the semiconductor substrate and includes at least one second amorphous semiconductor strip of a second conductivity type that differs from the first conductivity type, the first and second amorphous semiconductor strips being arranged alternately as viewed along an in-plane direction of the semiconductor substrate. The first electrodes are arranged spaced apart from each other on the first amorphous semiconductor section. The second electrodes are arranged spaced apart from each other on the second amorphous semiconductor section. The first and second amorphous semiconductor strips each have at least one reduced-thickness region where that first or second amorphous semiconductor strip has a reduced thickness, the reduced-thickness region being provided across the first and second amorphous semiconductor strips in a width direction thereof. The reduced-thickness region has no electrodes formed in a segment thereof where the reduced-thickness region has a positive curvature with respect to a length direction of the first and second amorphous semiconductor strips.

In the segments where the curvature r is positive, the conductive layer has a reduced thickness, and therefore open-circuit voltage is low. If these segments were connected to the electrodes, the photovoltaic conversion device would exhibit deteriorated properties. In the photovoltaic conversion device in accordance with the embodiment of the present invention, no electrodes are provided in segments where the curvature r is positive. The properties therefore do not deteriorate.

The conductive semiconductor layers in the reduced-thickness regions exhibit an electric-field-passivation effect, which in turn prevents carrier lifetime from decreasing and thereby contributes to efficient collection of carriers by the electrodes.

Therefore, the photovoltaic conversion device can exhibit improved conversion efficiency.

The photovoltaic conversion device preferably further includes a passivation film between the semiconductor substrate and the first and second amorphous semiconductor sections.

The passivation film has a chemical passivation effect. Thus, this structure restricts recombination of carriers at the interface between the semiconductor substrate and the passivation film, thereby achieving increased efficiency in the collection of carriers.

The structure can hence further improve the conversion efficiency of the photovoltaic conversion device.

The passivation film preferably contains intrinsic hydrogenated amorphous silicon.

In a step that follows the formation of the passivation film, semiconductor layers are formed at a temperature approximately equal to the temperature at which the passivation film is formed. That reduces the thermal strain experienced by the semiconductor substrate, thereby suppressing the deterioration of properties of the semiconductor substrate. Also, the dangling bonds on the surface of the semiconductor substrate can be bonded to hydrogen atoms, which restricts recombination of carriers.

The photovoltaic conversion device can hence exhibit further improved conversion efficiency.

The reduced-thickness region preferably contains in the segment either a dopant of the first conductivity type at or in excess of $1 \times 10^{20}$ atoms/cm$^{-3}$ or a dopant of the second conductivity type at or in excess of $1 \times 10^{20}$ atoms/cm$^{-3}$.

If the segments of the reduced-thickness regions where the curvature is positive are a dopant-containing, highly conductive layer, the conductive semiconductor layers exhibit an electric-field-passivation effect, which in turn prevents carrier lifetime from decreasing and thereby contributes to efficient collection of carriers by the electrodes.

The photovoltaic conversion device can hence exhibit further improved conversion efficiency.

The reduced-thickness region preferably has a thickness of greater than or equal to 1 nm in the segment.

If the segments of the reduced-thickness regions where the curvature is positive have a thickness of greater than or equal to 1 nm, there exists a conductive layer in the segments where the curvature is positive. Due to an electric-field-passivation effect of the conductor layer, carrier lifetime does not decrease, and carriers are thereby efficiently collected by the electrodes. The fill factor also improves, contributing to improvement of properties, over a structure in which the amorphous semiconductor strips are spaced apart. A good electric-field-passivation effect is also achieved.

The photovoltaic conversion device can hence exhibit further improved conversion efficiency.

The present invention, in another embodiment thereof, is directed to a photovoltaic module including a conductive section and a plurality of photovoltaic conversion devices. The conductive section includes a wiring sheet or a wire grid. The photovoltaic conversion devices are provided on the conductive section. Each photovoltaic conversion device may be any one of the photovoltaic conversion devices described above.

The photovoltaic conversion devices described above can exhibit improved conversion efficiency. The photovoltaic module, since including these photovoltaic conversion devices, can also exhibit improved conversion efficiency.

The present invention, in a further embodiment thereof, is directed to a solar power generation system including a photovoltaic module array and a power converter. The photovoltaic module array includes a plurality of photovoltaic modules. The power converter is configured to convert DC power received from the photovoltaic module array to AC power. Each photovoltaic module may be the photovoltaic module described above.

The photovoltaic module described above can exhibit improved conversion efficiency. The solar power generation system can hence exhibit improved conversion efficiency.

The present invention, in still another embodiment thereof, is directed to a solar power generation system including a plurality of solar power generation subsystems and a plurality of power converters. Each power converter is associated with a different one of the solar power generation subsystems. The solar power generation subsystems each include a plurality of module systems. The module systems each include a plurality of photovoltaic module arrays. The photovoltaic module arrays each include a plurality of photovoltaic modules. Each photovoltaic module may be the photovoltaic module described above.

The solar power generation system in accordance with the embodiment has a larger scale than the solar power generation system described earlier, and can still exhibit improved conversion efficiency.

Advantageous Effects of Invention

The conversion efficiency of a photovoltaic conversion device, a photovoltaic module, and a solar power generation system can be improved.

DESCRIPTION OF EMBODIMENTS

Figure 1:
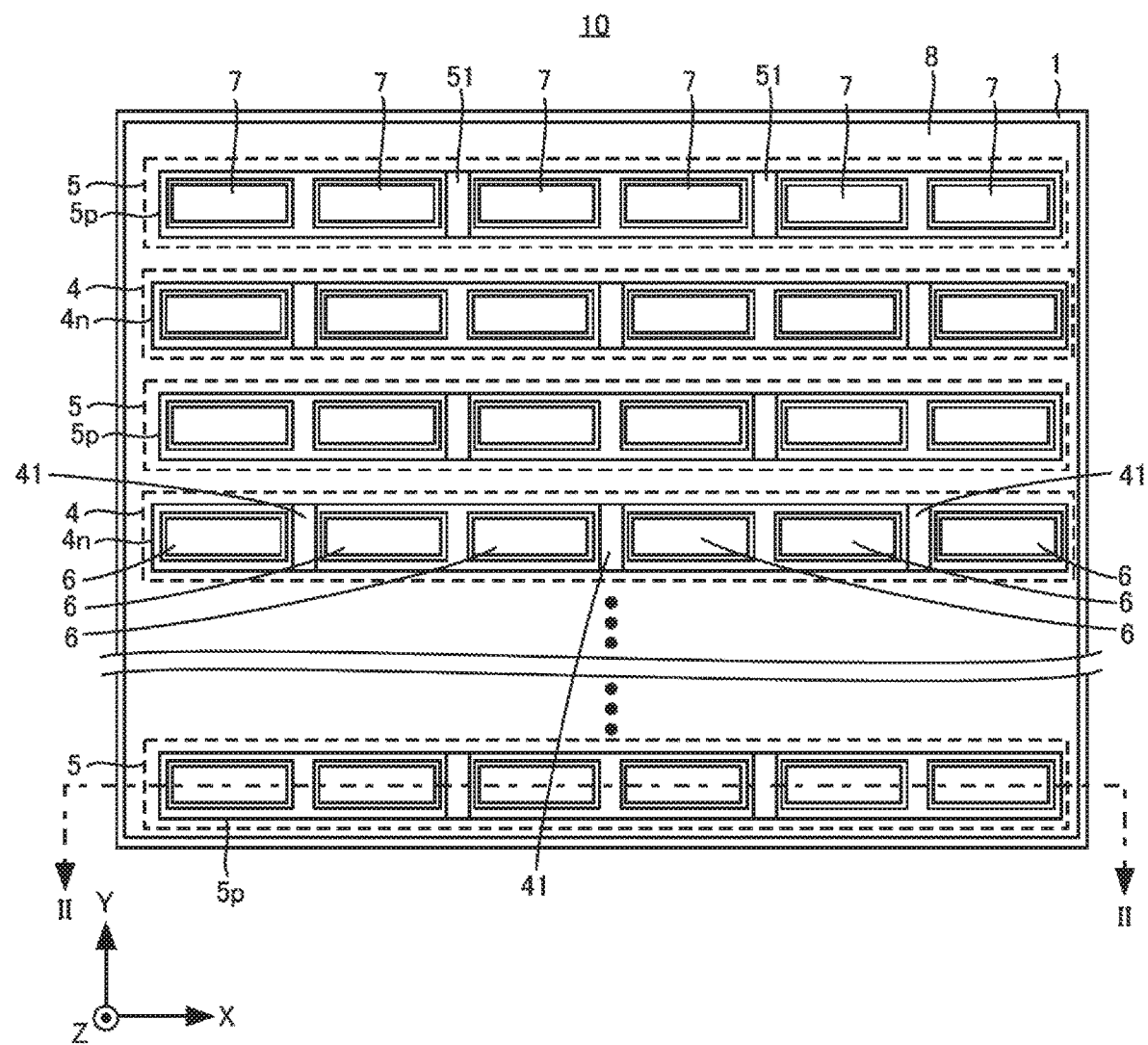
FIG. 1 is a plan view of a structure of a photovoltaic conversion device in accordance with Embodiment 1 of the present invention.

A detailed description will be given of embodiments of the present invention in reference to drawings. Identical or equivalent members will be denoted by the same reference signs throughout the drawings, and description thereof is not repeated.

Throughout this specification, the amorphous semiconductor strip may have a microcrystalline phase. The microcrystalline phase contains crystals with an average particle diameter of 1 to 50 nm. Also throughout the specification, the photovoltaic conversion device encompasses a photovoltaic conversion element, a photovoltaic module using photovoltaic conversion elements, and a photovoltaic power generation system including photovoltaic modules. For clarity purposes, the drawings to which reference will be made in the following description may show structures in a simplified or schematic form or omit some structural members. The relative dimensions of structural members as they are shown in the drawings may not represent the actual relative dimensions thereof.

Embodiment 1

Figure 2:
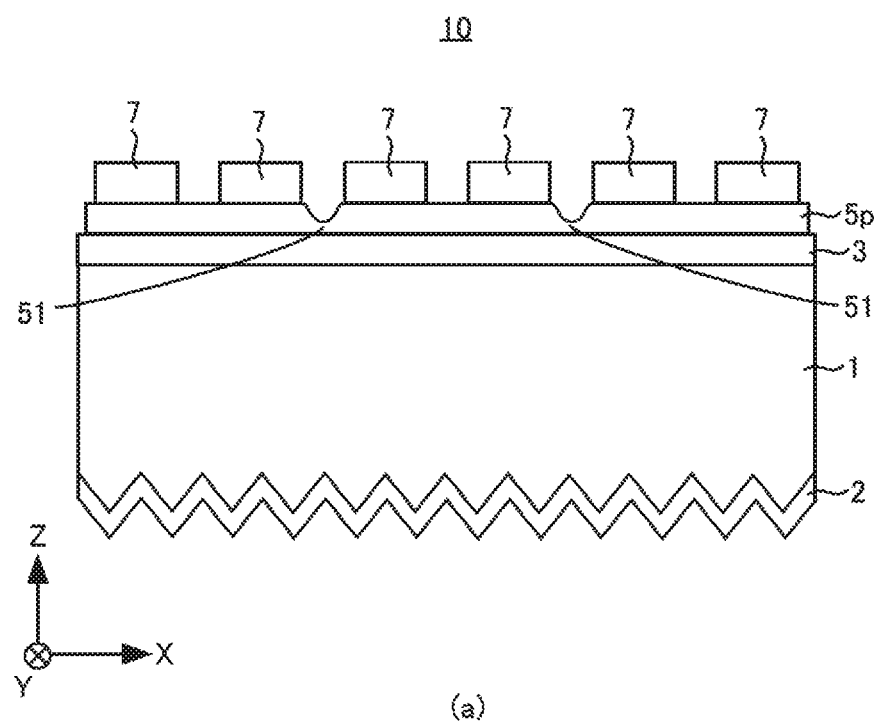
FIG. 2 is a cross-sectional view of the photovoltaic conversion device shown in FIG. 1 taken along line II-II.
Figure 2:
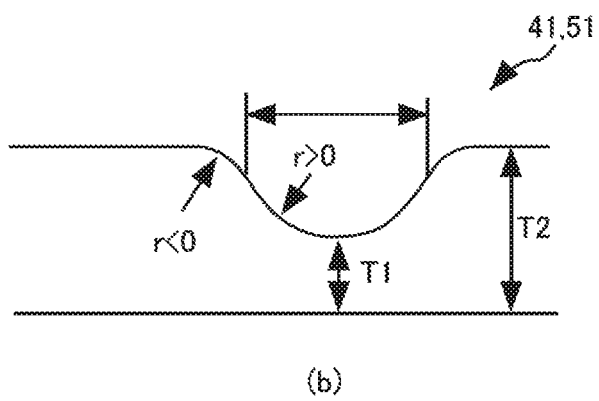

FIG. 1 is a plan view of a structure of a photovoltaic conversion device in accordance with Embodiment 1 of the present invention. FIG. 2 is a cross-sectional view of the photovoltaic conversion device shown in FIG. 1 taken along line II-II.

Referring to FIGS. 1 and 2, a photovoltaic conversion device 10 in accordance with Embodiment 1 of the present invention includes a semiconductor substrate 1, an antireflective film 2, a passivation film 3, n-type amorphous semiconductor sections 4, p-type amorphous semiconductor sections 5, and electrodes 6 and 7.

The semiconductor substrate 1 is, for example, an n-type monocrystalline silicon substrate. The semiconductor substrate 1 has a thickness of, for example, 100 to 150 µm. The semiconductor substrate 1 has texture on one of the surfaces thereof. The face on which the texture is formed will be referred to as the "light-receiving face."

The antireflective film 2 is positioned in contact with one of the surfaces (light-receiving face) of the semiconductor substrate 1.

The passivation film 3 is positioned in contact a face of the semiconductor substrate 1, opposite the light-receiving face.

The n-type amorphous semiconductor sections 4 are positioned in contact with the passivation film 3.

The p-type amorphous semiconductor section 5 is positioned adjacent to the n-type amorphous semiconductor section 4 as traced along an in-plane direction of the semiconductor substrate 1 (Y-axis direction). More particularly, the p-type amorphous semiconductor sections 5 are separated by desired distances from the n-type amorphous semiconductor sections 4 in the in-plane direction of the semiconductor substrate 1 (Y-axis direction).

The n-type amorphous semiconductor sections 4 and the p-type amorphous semiconductor sections 5 are arranged alternately as viewed along the in-plane direction of the semiconductor substrate 1 (Y-axis direction).

Each n-type amorphous semiconductor section 4 includes at least one n-type amorphous semiconductor strip 4n. Each n-type amorphous semiconductor strip 4n has reduced-thickness regions 41 at desired intervals as traced along the length direction of the n-type amorphous semiconductor strip 4n (X-axis direction). The reduced-thickness regions 41 are parts of the n-type amorphous semiconductor strip 4n in which the n-type amorphous semiconductor strip 4n has a smaller thickness than in the other parts of the n-type amorphous semiconductor strip 4n. The reduced-thickness regions 41 extend all the way across the n-type amorphous semiconductor strip 4n, in the width direction of the n-type amorphous semiconductor strip 4n (Y-axis direction). Each n-type amorphous semiconductor strip 4n may have only one reduced-thickness region 41.

Each p-type amorphous semiconductor section 5 includes at least one p-type amorphous semiconductor strip 5p. The p-type amorphous semiconductor strip 5p has reduced-thickness regions 51 at desired intervals as traced along the length direction of the p-type amorphous semiconductor strip 5p (X-axis direction). The reduced-thickness regions 51 are parts of the p-type amorphous semiconductor strip 5p in which the p-type amorphous semiconductor strip 5p has a smaller thickness than in the other parts of the p-type amorphous semiconductor strip 5p. The reduced-thickness regions 51 extend all the way across the p-type amorphous semiconductor strip 5p, in the width direction of the p-type amorphous semiconductor strip 5p (Y-axis direction). Each p-type amorphous semiconductor strip 5p may have only one reduced-thickness region 51.

The electrodes 6 are positioned on the n-type amorphous semiconductor strips 4n in contact with the n-type amorphous semiconductor strips 4n.

The electrodes 7 are positioned on the p-type amorphous semiconductor strips 5p in contact with the p-type amorphous semiconductor strips 5p.

Preferably, the electrodes 6 are provided on the n-type amorphous semiconductor strips 4n, and the electrodes 7 are provided on the p-type amorphous semiconductor strips 5p for the following reason.

If the electrodes 6 (or the electrodes 7) were formed in gap regions between adjacent n- and p-type amorphous semiconductor sections 4n and 5p, there would occur increased current leak through the passivation film 3 in the p-n junctions in these regions.

Therefore, adjacent electrodes 6 and 7 are separated by a distance L in the Y-axis direction. The distance L is, for example, approximately 100 to 300 µm.

As shown in (b) of FIG. 2, each reduced-thickness region 41 and 51 has segments where the reduced-thickness region 41 or 51 exhibits a negative curvature r with respect to the length direction of the n- or p-type amorphous semiconductor strips 4n and 5p (X-axis direction) and also has segments where the reduced-thickness region 41 or 51 exhibits a positive curvature r with respect to that length direction. In the photovoltaic conversion device 10, there are provided no electrodes 6 and 7 in the segments of the reduced-thickness regions 41 and 51 where the curvature r is positive for the following reasons.

The reduced-thickness regions 41 and 51 contain a thin conductive layer. Therefore, open-circuit voltage decreases in these regions. If the segments in question of the reduced-thickness regions 41 and 51 were connected to electrodes, the fill factor would decrease, and the conversion efficiency would therefore decrease.

The n- and p-type amorphous semiconductor strips 4n and 5p have a thickness T1 in the reduced-thickness regions 41 and 51 and a thickness T2 in the other parts thereof where no reduced-thickness regions 41 and 51 are formed. The thickness T1 is in the range of 10% to 80% of the thickness T2.

As described here, the n- and p-type amorphous semiconductor strips 4n and 5p have the reduced-thickness regions 41 and 51 respectively at desired intervals in the length direction thereof (X-axis direction). The n- and p-type amorphous semiconductor strips 4n and 5p however have the thickness T1 in the reduced-thickness regions 41 and 51, which is 10 to 80% the thickness T2 of the n- and p-type amorphous semiconductor strips 4n and 5p in the other parts thereof. As a result, the n-type amorphous semiconductor strips 4n (and the p-type amorphous semiconductor strips 5p) are continuous in the length direction thereof (X-axis direction). This structure can achieve a better passivation effect than a structure in which the n-type amorphous semiconductor strips 4n (and the p-type amorphous semiconductor strips 5p) are not continuous in the length direction thereof.

The absence of electrodes 6 and 7 in the segments of the reduced-thickness regions 41 and 51 where the curvature r is positive improves the fill factor and provides the photovoltaic conversion device 10 with good properties for the following reasons. The reduced-thickness regions 41 and 51 contain a thin conductive layer. Therefore, open-circuit voltage decreases in these regions. If the segments in question of the reduced-thickness regions 41 and 51 were connected to electrodes, the photovoltaic conversion device 10 would exhibit deteriorated properties.

The reduced-thickness regions 41 and Si contain a p- or n-type dopant. Secondary ion mass spectroscopy ("SIMS") reveals that the reduced-thickness regions 41 and 51 contain a dopant (boron or phosphorus) at or in excess of $1 \times 10^{20}$ atoms/cm$^{-3}$, as an example.

The reduced-thickness regions 41 and 51 are preferably dopant-containing, highly conductive layers for the following reasons. If the reduced-thickness regions 41 and 51 are highly conductive layers, the conductive semiconductor layers will provide a good electric-field-passivation effect, preventing carrier lifetime from decreasing and thereby contributing to efficient collection of carriers by the electrodes.

The dopant may be detected by any non-SIMS method such as EDX (energy dispersive X-ray analysis).

Below the reduced-thickness regions 41 and 51, carrier lifetime does not decrease, and carriers are thereby efficiently collected by the electrodes, due to an electric-field-passivation effect by the n- and p-type amorphous semiconductor strips 4n and 5p as well as due to the chemical passivation effect by the passivation film 3.

Therefore, the fill factor improves, contributing to improvement of properties, over a structure in which the n- and p-type amorphous semiconductor strips 4n and 5p are spaced apart with there being no reduced-thickness regions 41 and 51.

The reduced-thickness regions 41 and 51 preferably have a thickness of at least 1 nm in order to provide a good electric-field-passivation effect. The reduced-thickness regions 41 and 51 are thinner than the other parts of the n- and p-type amorphous semiconductor strips 4n and 5p and for this reason are never thicker than the other parts of the n- and p-type amorphous semiconductor strips 4n and 5p.

Since the reduced-thickness regions 41 and 51 are thinner than the other parts of the n- and p-type amorphous semiconductor strips 4n and 5p, the semiconductor substrate 1 experiences less stress, hence less likely to bend and warp, in this structure than in a structure in which the n-type amorphous semiconductor strips and the p-type amorphous semiconductor strips are continuous with there being no reduced-thickness regions 41 and 51.

In the photovoltaic conversion device 10, the locations of the reduced-thickness regions 41 along the X-axis direction differ from the locations of the reduced-thickness regions 51 along the X-axis direction. Due to these differences in the locations of the reduced-thickness regions 41 and 51, the semiconductor substrate 1 may experience less stress, hence less likely to bend and warp, in this structure than in a structure in which the reduced-thickness regions 41 and 51 are provided in the same locations. The reduced-thickness regions 41 and 51 have a length of, for example, less than or equal to 2 mm in the X-axis direction, which is shorter than the diffusion length (e.g., approximately 2 mm) of carriers electrons and holes) produced in the semiconductor substrate 1. Thus, this structure restricts recombination of carriers under the reduced-thickness regions 41 and 51, thereby achieving increased efficiency in the collection of carriers.

The antireflective film 2 is composed of, for example, a silicon oxide film and a silicon nitride film. The silicon oxide film is positioned in contact with the semiconductor substrate 1, and the silicon nitride film is positioned in contact with the silicon oxide film. The silicon oxide film has a thickness of, for example, 20 nm, and the silicon nitride film has a thickness of, for example, 60 nm.

The passivation film 3 is made of, for example, any one of amorphous silicon, amorphous silicon oxide, amorphous silicon nitride, amorphous silicon oxynitride, amorphous silicon carbide, polycrystalline silicon, and alumina.

In Embodiment 1, the passivation film 3 is a silicon oxide film. The passivation film 3 may alternatively be a thermally oxidized silicon film or a silicon oxide film formed by vapor deposition such as plasma CVD (chemical vapor deposition).

The passivation film 3 has a thickness of, for example, 10 nm or less. The passivation film 3, if reduced in thickness to less than 10 nm, provides less passivation and if increased in thickness, exhibits an excessive series resistance component. With all these passivation and series resistance component considered, the passivation film 3 preferably has a thickness of 10 nm or less.

The n-type amorphous semiconductor strips 4n are hydrogen-containing, n-type amorphous semiconductor strips. The n-type amorphous semiconductor strips 4n are made of, for example, n-type amorphous silicon, n-type amorphous silicon germanium, n-type amorphous germanium, n-type amorphous silicon carbide, n-type amorphous silicon nitride, n-type amorphous silicon oxide, n-type amorphous silicon oxynitride, or n-type amorphous silicon carbon oxide.

The n-type amorphous semiconductor strips 4n contain, for example, phosphorus (P) as an n-type dopant.

The n-type amorphous semiconductor strips 4n have a thickness of, for example, 5 to 20 nm.

The p-type amorphous semiconductor strips 5p are hydrogen-containing, p-type amorphous semiconductor strips. The p-type amorphous semiconductor strips 5p are made of, for example, p-type amorphous silicon, p-type amorphous silicon germanium, p-type amorphous germanium, p-type amorphous silicon carbide, p-type amorphous silicon nitride, p-type amorphous silicon oxide, p-type amorphous silicon oxynitride, or p-type amorphous silicon carbon oxide.

The p-type amorphous semiconductor strips 5p contain, for example, boron (B) as a p-type dopant.

The p-type amorphous semiconductor strips 5p have a thickness of, for example, 5 to 20 nm.

The electrodes 6 and 7 are composed of, for example, a metal such as Ag (silver), Ni (nickel), Al (aluminum), Cu (copper), Sn (tin), Pt (platinum), Au (gold), or Ti (titanium), a conductive oxide film such as ITO, an alloy of some or all of these metals, or a stack of films of some or all of these metals. The electrodes 6 and 7 are preferably composed of a high-conductivity metal. Each electrode 6 and 7 has a thickness of approximately 50 nm to 1 μm, for example.

The above examples assume that the semiconductor substrate 1 has a flat surface. In reality, however, the face of the semiconductor substrate 1 that has no texture thereon may in some cases have about 1 μm irregularities produced by etching performed for removing a damaged layer, for example. A description will be given next of a method of measuring the thickness of an amorphous semiconductor strip on an irregular surface of the semiconductor substrate 1.

Figure 3:
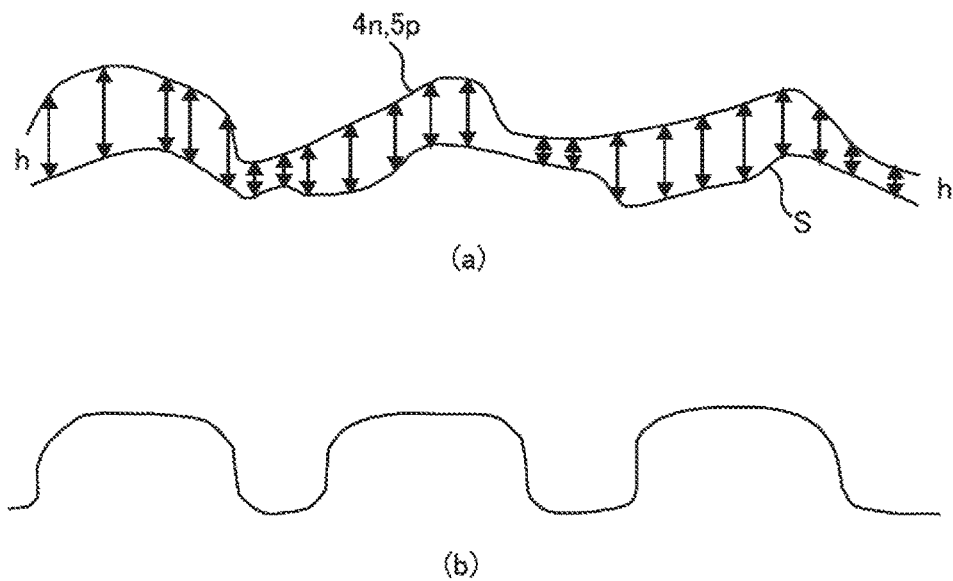
FIG. 3 is a diagram illustrating how the thickness of an amorphous semiconductor strip is measured when a semiconductor substrate has an irregular surface.

FIG. 3 is a diagram illustrating how the thickness of an amorphous semiconductor strip is measured when the semiconductor substrate 1 has an irregular surface.

On a semiconductor substrate 1 with irregularities on its surface is formed a passivation film 3, after which n-type amorphous semiconductor strips 4n having reduced-thickness regions 41 or p-type amorphous semiconductor strips 5p having reduced-thickness regions 51 are formed on the passivation film 3.

A picture is taken of a cross-section of the semiconductor substrate 1 by scanning electron microscope (SEM) or transmission electron microscopy (TEM). An interface S between the passivation film 3 and the semiconductor substrate 1 can be readily observed in this picture.

Portion (a) of FIG. 3 is a schematic diagram representing results of measurement of a distance (thickness h) from the interface S between the passivation film 3 and the surface of the semiconductor substrate 1 to the surface of the n-type amorphous semiconductor strip 4n or the p-type amorphous semiconductor strip 5p.

Portion (b) of FIG. 3 is obtained by re-plotting the values of the thickness h shown in (a) of FIG. 3. Using (b) of FIG. 3, the thickness of the amorphous semiconductor strip (i.e., n-type amorphous semiconductor strip or p-type amorphous semiconductor strip) can be readily determined assuming that the surface of the semiconductor substrate 1 is generally flat.

Where the semiconductor substrate 1 have texture on both faces thereof, the thickness of the structure on the texture may be measured and its values be re-plotted in a manner similar to that described above, to locate reduced-thickness regions.

The face of a silicon wafer that has no texture thereon has a difference in height of approximately 2 µm at most; this difference is still very small compared with the difference on the face with texture (several tens of micrometers at most), and the face can be safely considered flat.

Thus, taking into consideration the ease with which contacts can be made to external wiring such as a wiring sheet which will be detailed later and the difficulty with which a short circuit can occur between the electrodes 6 and 7, basically, the passivation film 3, the n-type amorphous semiconductor strips 4n, and the p-type amorphous semiconductor strips 5p, as examples, would preferably be formed on the back face (i.e., the face with no texture) which is relatively flat.

However, to trap incident light efficiently in the semiconductor substrate 1, the back face of the semiconductor substrate 1 preferably also has texture. The additional texture on the back face of the semiconductor substrate 1 increases the surface area of the semiconductor substrate 1 (about 1.7 times), thereby reducing contact resistance.

Furthermore, to form texture only on one face of the semiconductor substrate 1, anisotropic etching necessitates an extra step for protecting the face on which no texture is to be provided. In contrast, if texture is to be formed on both faces of the semiconductor substrate 1, there is no need to protect the faces of the semiconductor substrate 1, which reduces the number of steps in the process.

Next will be described a structure of a conductive section for the photovoltaic conversion device 10.

Figure 4:
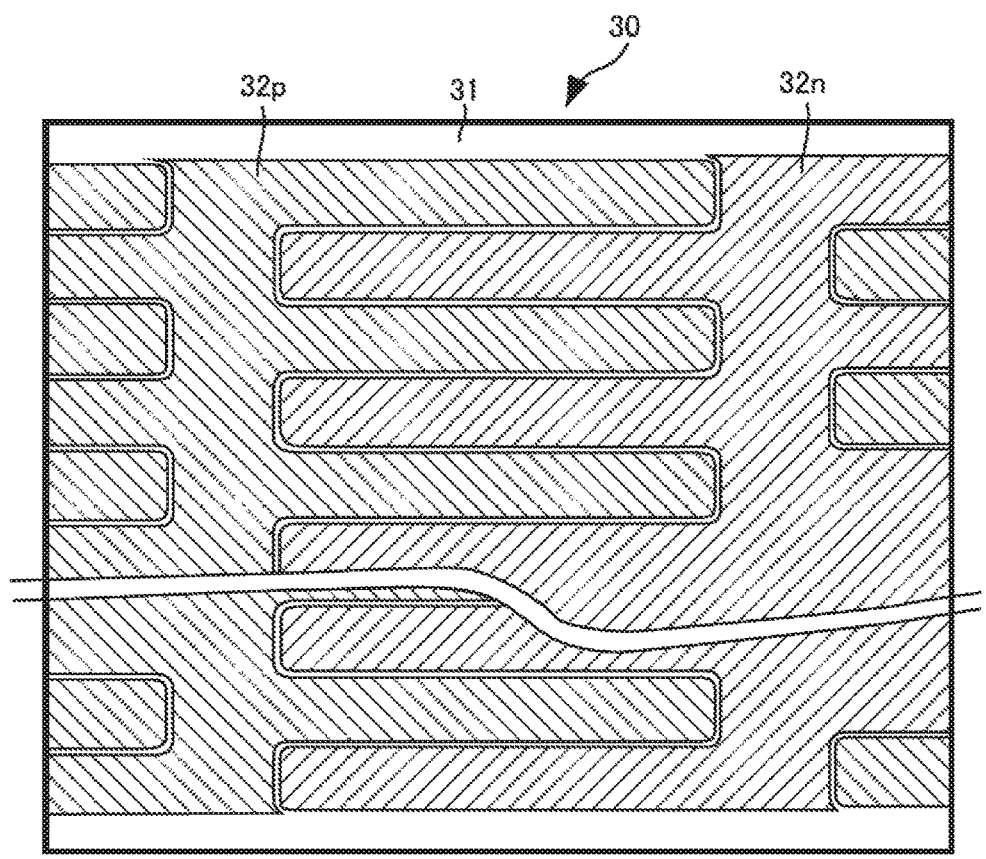
FIG. 4 is an enlarged schematic view of a part of a wiring sheet in accordance with an embodiment of the present invention.
Figure 5:
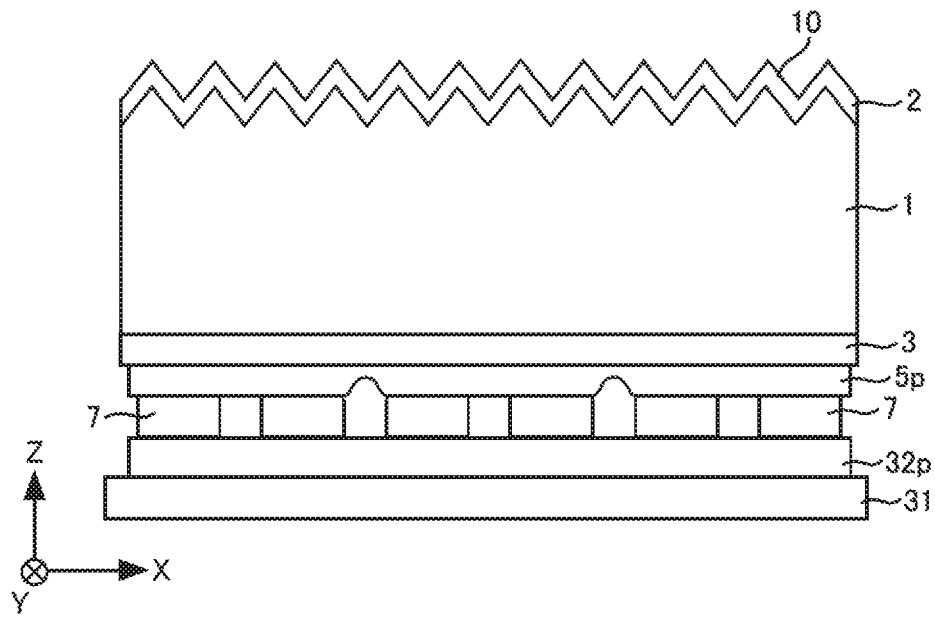
FIG. 5 is a schematic view of a cross-section of a photovoltaic conversion device (including a conductive section).
Figure 6:
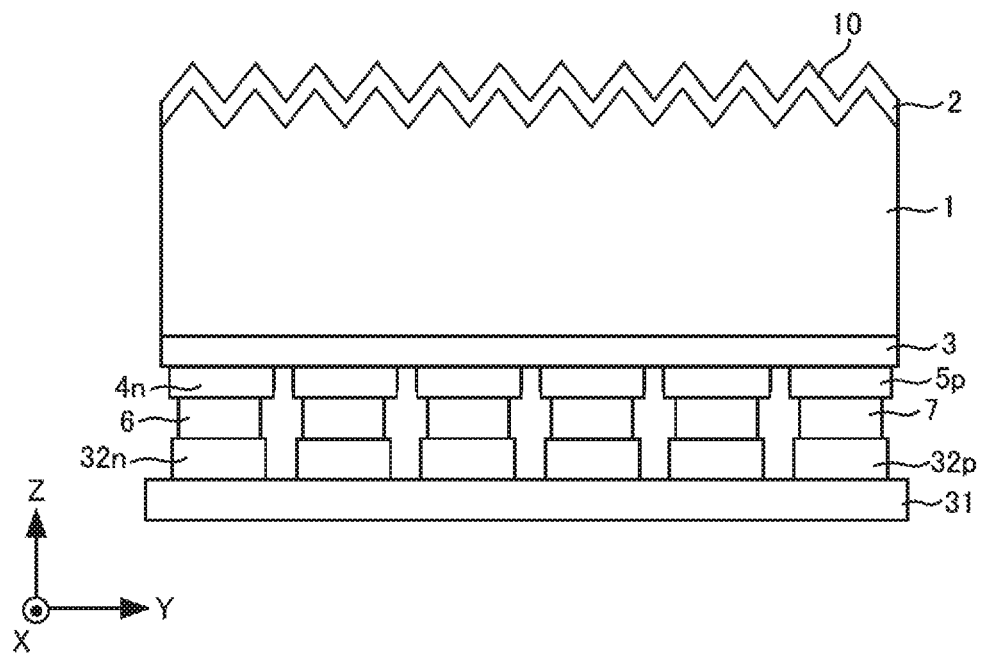
FIG. 6 is a schematic view of a cross-section of a photovoltaic conversion device including a conductive section) taken along a different direction.
Figure 7:
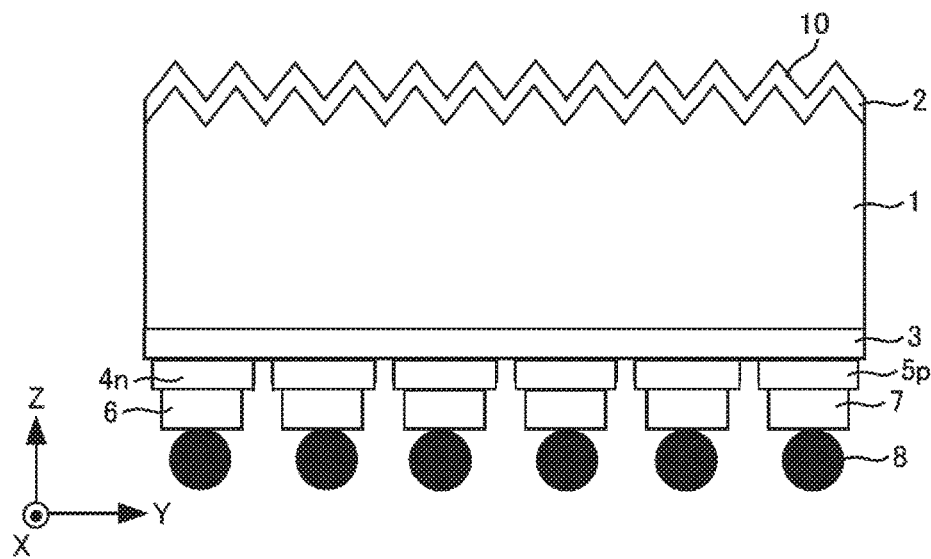
FIG. 7 is a schematic view of a cross-section of a photovoltaic conversion device including a conductive section) that uses a wire grid.

FIG. 4 is an enlarged schematic view of a part of a wiring sheet in an embodiment of the present invention. FIG. 5 is a schematic view of a cross-section of a photovoltaic conversion device (including a conductive section). FIG. 6 is a schematic view of a cross-section of a photovoltaic conversion device (including a conductive section) taken along a different direction. FIG. 7 is a schematic view of a cross-section of a photovoltaic conversion device (including a conductive section) that uses a wire grid.

In forming a conductive section for the photovoltaic conversion device 10, the photovoltaic conversion device 10 is electrically connected to a wiring circuit. The external wiring circuit may be, for example, a wiring sheet shown in FIG. 4. Alternatively, a wire grid 8 may be used to form connections as shown in FIG. 7.

Referring to FIG. 4, a wiring sheet 30 includes an insulating substrate 31, a wiring member 32n for use with n-type members, and a wiring member 32p for use with p-type members. The wiring members 32n and 32p are provided on the insulating substrate 31.

The insulating substrate 31 may be made of any insulating material such as polyethylene terephthalate (PET), polyethylene naphthalate (PEN), polyphenylene sulfide (PPS), polyvinyl fluoride (PVF), or polyimide. The thickness of the insulating substrate 31 is by no means limited to any particular value and preferably not smaller than 25 µm and not larger than about 150 µm. The insulating substrate 31 may have a single-layer structure or a multi-layer structure with two or more layers.

The wiring members 32n and 32p are interdigitated and have teeth disposed alternately at prescribed intervals. The electrodes 6 and 7 on the back face of the photovoltaic conversion device 10 are joined to the wiring members 32n and 32p respectively (see FIGS. 5 and 6).

Connection wiring (not shown) is provided on the surface of the insulating substrate 31. The wiring members 32n and 32p for adjacent photovoltaic conversion devices 10 are electrically connected via the connection wiring, and these adjacent photovoltaic conversion devices 10 on the wiring sheet 30 are also electrically connected to each other via the connection wiring. This structure enables the electric current produced by the light striking the light-receiving face of the photovoltaic conversion device 10 to be taken out externally via the wiring members 32p and 32n.

The wiring members 32n and 32p may be made of any conductive material, including a metal such as Cu, Al, or Ag or an alloy composed primarily of some or all of these metals.

The wiring members 32n and 32p has a thickness that is by no means limited to any particular value. As a preferred example, the thickness is not smaller than 10 µm and not larger than 100 µm. If the thickness of the wiring members 32n and 32p is smaller than 10 µm, the wiring resistance could be excessively high. If the thickness is larger than 100 µm, heat needs to be applied when the wiring members 32n and 32p are attached to the photovoltaic conversion device 10. As such, for a thickness in excess of 100 µm, for example, differences between the thermal expansion coefficient of the semiconductor substrate 1 of the photovoltaic conversion device 10 and those of the wiring members 32n and 32p cause the wiring sheet 30 to warp appreciably. In view of this, the thickness of the wiring members 32n and 32p is more preferably not larger than 100 µm.

Furthermore, a conductive material such as nickel, gold, platinum, palladium, silver, tin, indium, or ITO may be provided on portions of the surfaces of the wiring members 32n and 32p. This arrangement provides good electrical connection between the wiring members 32n and 32p and the electrodes 6 and 7 of the photovoltaic conversion device 10 respectively, thereby improving the weather resistance of the wiring members 32n and 32p. The wiring members 32n and 32p may have a single-layer structure or a multi-layer structure with two or more layers.

Next will be described a method of forming the p- and n-type amorphous semiconductor strips using metal masks.

Figure 8:
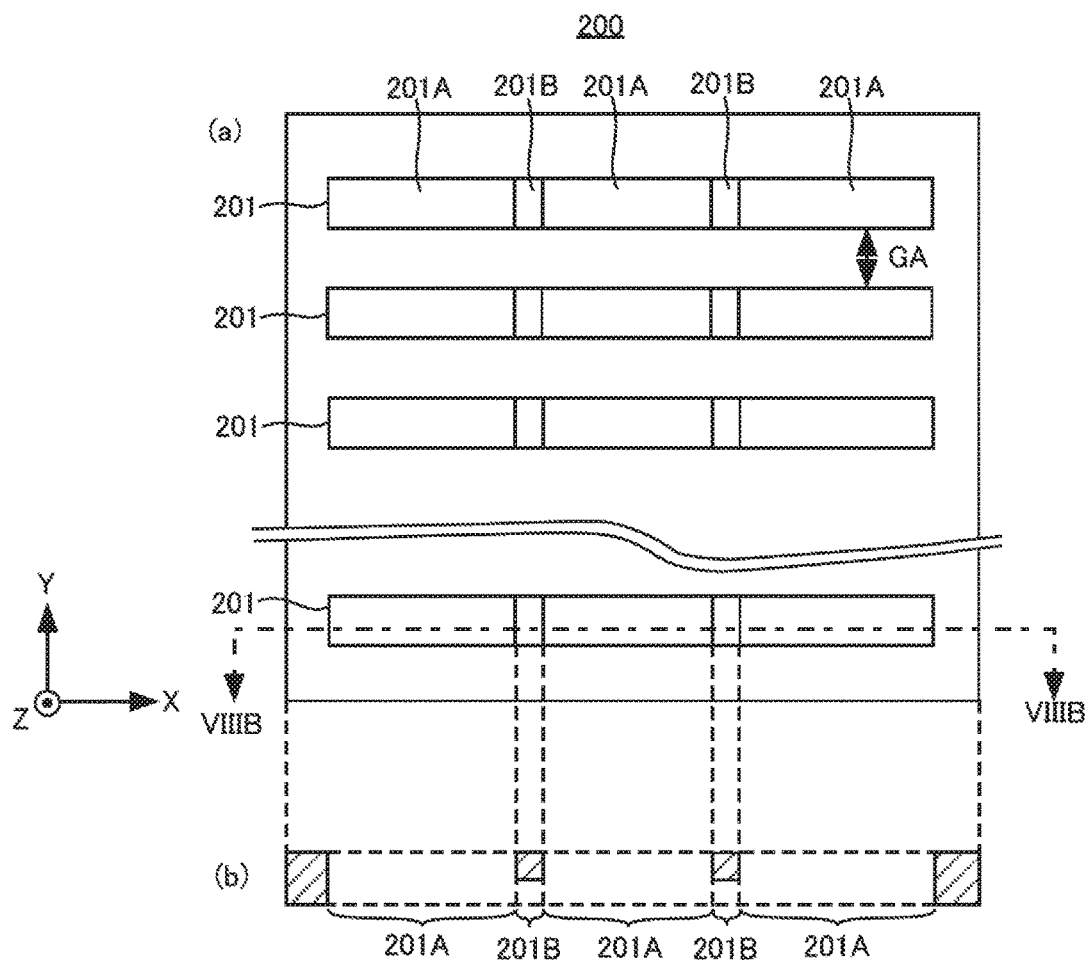
FIG. 8 is a plan view of a metal mask for forming p-type amorphous semiconductor strips.

FIG. 8 is a plan view of a metal mask for forming the p-type amorphous semiconductor strips 5p.

Portion (b) of FIG. 8 is a cross-sectional view of the metal mask shown in (a) of FIG. 8 taken along line VIIIB-VIIIB.

Referring to FIG. 8, a metal mask 200 has a plurality of opening regions 201 to form the p-type amorphous semiconductor strips 5p.

The opening regions 201 are arranged at equal intervals GA as traced along the Y-axis direction (see (a) of FIG. 8 reference). The interval GA is approximately less than or equal to 2 mm.

Each opening region 201 has openings 201A to form the p-type amorphous semiconductor strips 5p other than the reduced-thickness regions 51 and convex sections 201B to form the reduced-thickness regions 51.

The convex sections 201B are formed by half etching such that the depth (length in the Z-axis direction) thereof is approximately half the length of the openings 201A in the Z-axis direction.

The convex sections 201B, provided in this manner, divide each opening region 201 and hence lower the aspect ratio (ratio of the lengths of the long and short sides) of the opening 201A. The aspect ratio of the opening 201A is preferably less than or equal to 300. These values of the aspect ratio can enhance the mechanical strength of the metal mask 200, and even when the metal mask is washed or heated, restrain the metal mask 200 from warping.

The p-type amorphous semiconductor strips 5p are formed by plasma CVD, and the reactant gas flows all the way below the half-etched convex sections 201B, thereby forming the p-type amorphous semiconductor strips 5p with a smaller thickness below the convex sections 201B in the reduced-thickness regions 51 than in the openings 201A. Depending on the size of the convex sections 201B, the p-type amorphous semiconductor strips 5p below the convex sections 201B may have a thickness approximately 10% to 80% that of those p-type amorphous semiconductor strips 5p which are formed in the openings 201A.

The metal mask 200 may be made of a metal such as stainless steel, copper, nickel, a nickel-containing alloy (e.g., SUS 430, Alloy 42, or FeNi36), or molybdenum. Instead of the metal mask 200, a mask made of glass, a ceramic (e.g., alumina or zirconia), or an organic film may be used. Alternatively, a mask made by etching a semiconductor substrate may be used. The thickness of the metal mask 200 is preferably about 50 μm to 300 μm, as an example. In such a case, the metal mask 200 is unlikely to be bent or detached by magnetic force.

Taking the thermal expansion coefficient and material cost of the semiconductor substrate 1 into consideration, the metal mask 200 is more preferably made of Alloy 42. Regarding the thickness of the metal mask 200, when manufacturing costs are taken into consideration, using the metal mask 200 only once and discarding it would be questionable. Since using the metal mask 200 multiple times reduces running costs of production, it is preferable to recycle the metal mask 200 and use it multiple times. In such a case, films formed on the metal mask 200 are removed using hydrofluoric acid or NaOH.

Figure 9:
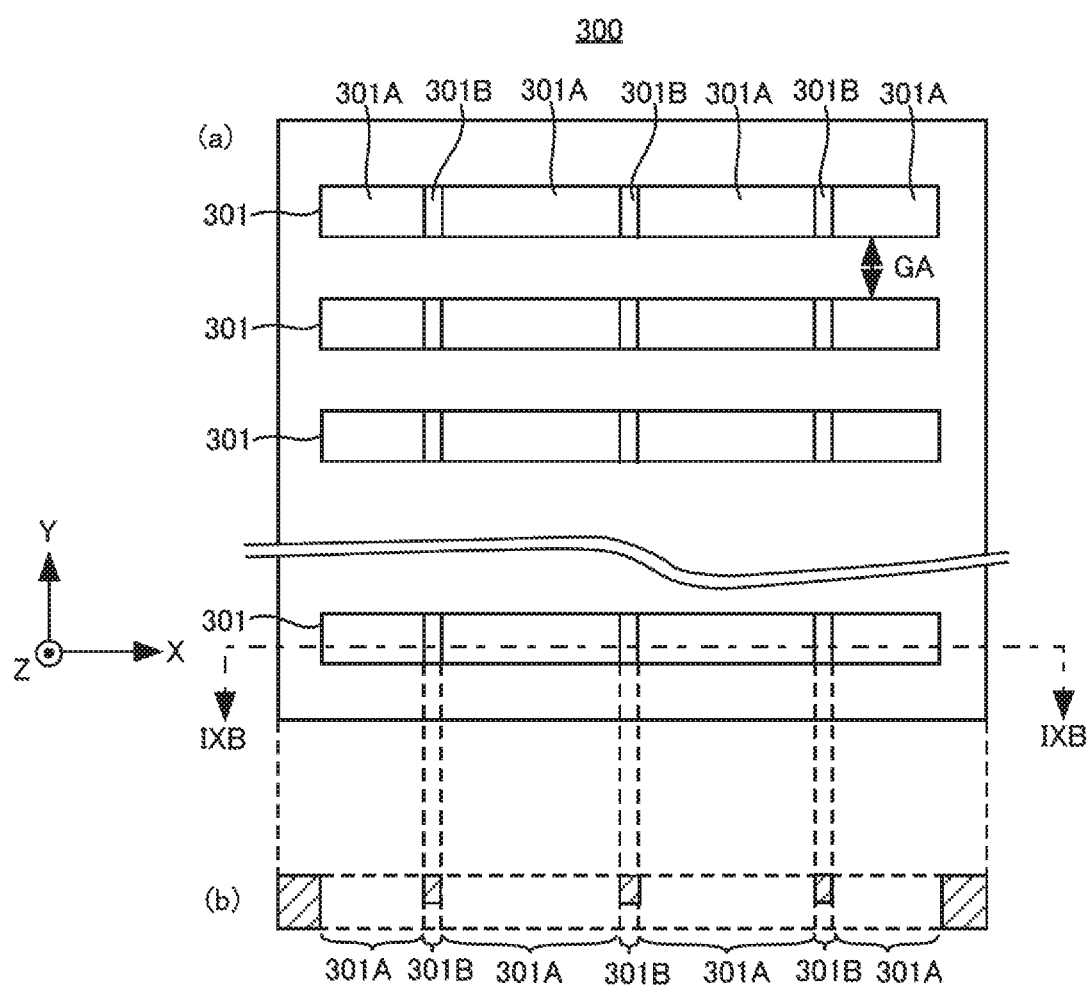
FIG. 9 is a plan view of a metal mask for forming n-type amorphous semiconductor strips.

FIG. 9 is a plan view of a metal mask for forming the n-type amorphous semiconductor strips 4n. Referring to FIG. 9, a metal mask 300 has a plurality of opening regions 301 to form the n-type amorphous semiconductor strips 4n.

The detailed description of the metal mask 200 shown in FIG. 8 is equally applicable to the metal mask 300, by replacing the opening regions 201, openings 201A, and convex sections 201B with the opening regions 301, openings 301A, and convex sections 301B respectively, replacing the p-type amorphous semiconductor strips 5p with the n-type amorphous semiconductor strips 4n, and replacing the reduced-thickness regions 51 with the reduced-thickness regions 41.

In the metal mask 300, the interval GA that separate openings 301A that are adjacent in the Y-axis direction is approximately 500 to 1500 μm.

Figure 10:
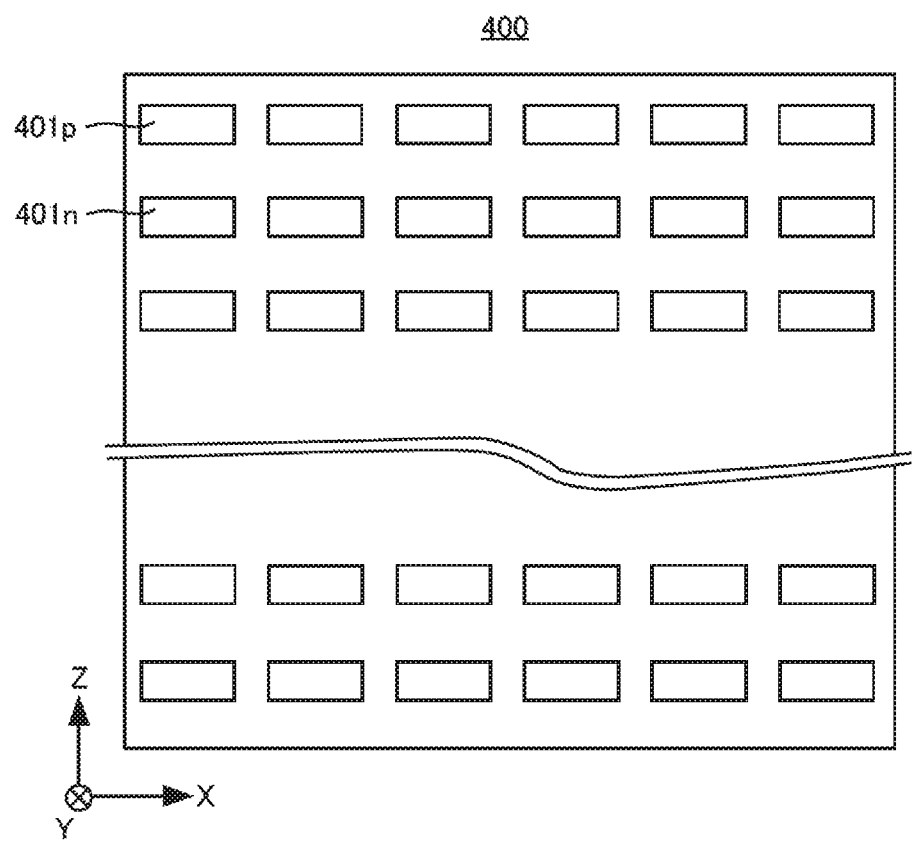
FIG. 10 is a plan view of a metal mask for forming electrodes.

FIG. 10 is a plan view of a metal mask for forming the electrodes 6 and 7. Referring to FIG. 10, a metal mask 400 has a plurality of openings 401n to form the electrodes 6 and a plurality of openings 401p to form the electrodes 7. The openings 401p and 401n preferably have an aspect ratio of less than or equal to 300.

The metal mask 400 is made using a material such as a metal, a ceramic, glass, or an organic material similarly to the metal masks 200 and 300. Depending on the materials and fabrication method used for the metal mask 400, the ends of the electrodes 6 and 7 formed using the metal mask 400 may not readily come out with sharp corners like the sharp corners of the openings 401p and 401n in the metal mask 400.

A method of forming the n- and p-type amorphous semiconductor strips 4n and 5p using metal masks has been described. This is however not the only possibility. Alternatively, similar n- and p-type amorphous semiconductor strips 4n and 5p may be formed, for example, by halftone printing in patterning using etching paste.

FIGS. 11 to 14 are first to fourth manufacturing step diagrams illustrating a method of manufacturing the photovoltaic conversion device 10 shown in FIG. 1.

Figure 11:
FIG. 11 is a first manufacturing step diagram illustrating a method of manufacturing the photovoltaic conversion device shown in FIG. 1.
Figure 11:
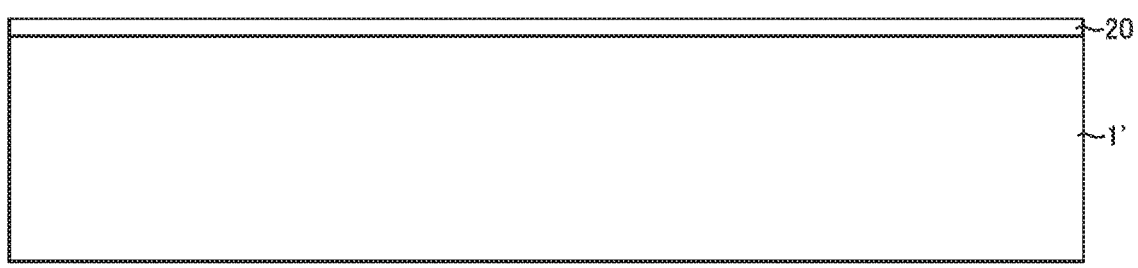
Figure 11:
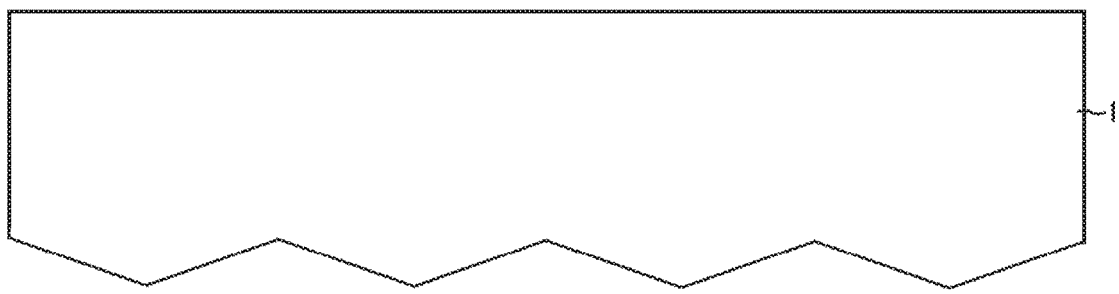
Figure 11:
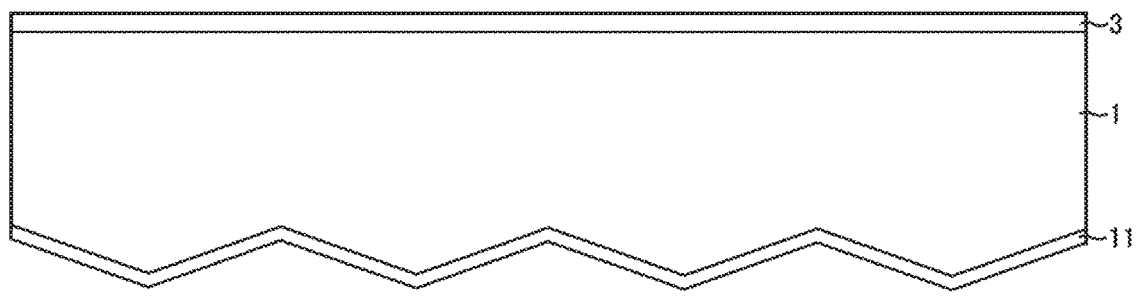

Referring to FIG. 11, to initiate the manufacture of the photovoltaic conversion device 10, a wafer with a thickness of 100 to 300 μm is cut out of bulk silicon using a wire saw. The wafer is then etched to remove damaged layers from the surface thereof and also to adjust the thickness thereof, in order to prepare a semiconductor substrate 1' (see the step shown in (a) of FIG. 11).

Thereafter, a protective film 20 is formed on one of the faces of the semiconductor substrate 1' (see the step shown in (b) of FIG. 11). The protective film 20 is composed of, for example, a silicon oxide film and a silicon nitride film.

The semiconductor substrate 1' on which the protective film 20 has been formed is then etched using an alkaline solution of, for example, NaOH or KOH an aqueous solution of 1 to 5 wt % KOH and 1 to 10 wt % isopropyl alcohol). This procedure concludes the anisotropic etching of a surface of the semiconductor substrate 1' opposite the surface thereof on which the protective film 20 is formed, thereby forming pyramidal texture thereon. The protective film 20 is then removed to obtain the semiconductor substrate 1 (see the step shown in (c) of FIG. 11).

Subsequently, the surfaces of the semiconductor substrate 1 are subjected to thermal oxidation to form an oxide film 11 on a light-receiving face of the semiconductor substrate 1 and the passivation film 3 on the back face of the semiconductor substrate 1 (opposite the light-receiving face thereof) (see the step shown in (d) of FIG. 11).

The semiconductor substrate 1 may be oxidized by either wet processing or thermal oxidation. In wet oxidation, for example, the semiconductor substrate 1 is immersed in hydrogen peroxide, nitric acid, or ozonated water and then heated at 800 to 1000° C. in a dry atmosphere. In thermal oxidation, for example, the semiconductor substrate 1 is heated to 900 to 1000° C. in an oxygen or water vapor atmosphere.

Following the step shown in (d) of FIG. 11, a silicon nitride film 12 is formed in contact with the oxide film 11 by sputtering, EB (Electron Beam) evaporation, or a TEOS method. This procedure concludes the formation of the antireflective film 2 on the light-receiving face of the semiconductor substrate 1 (see the step shown in (e) of FIG. 12).

Figure 12:
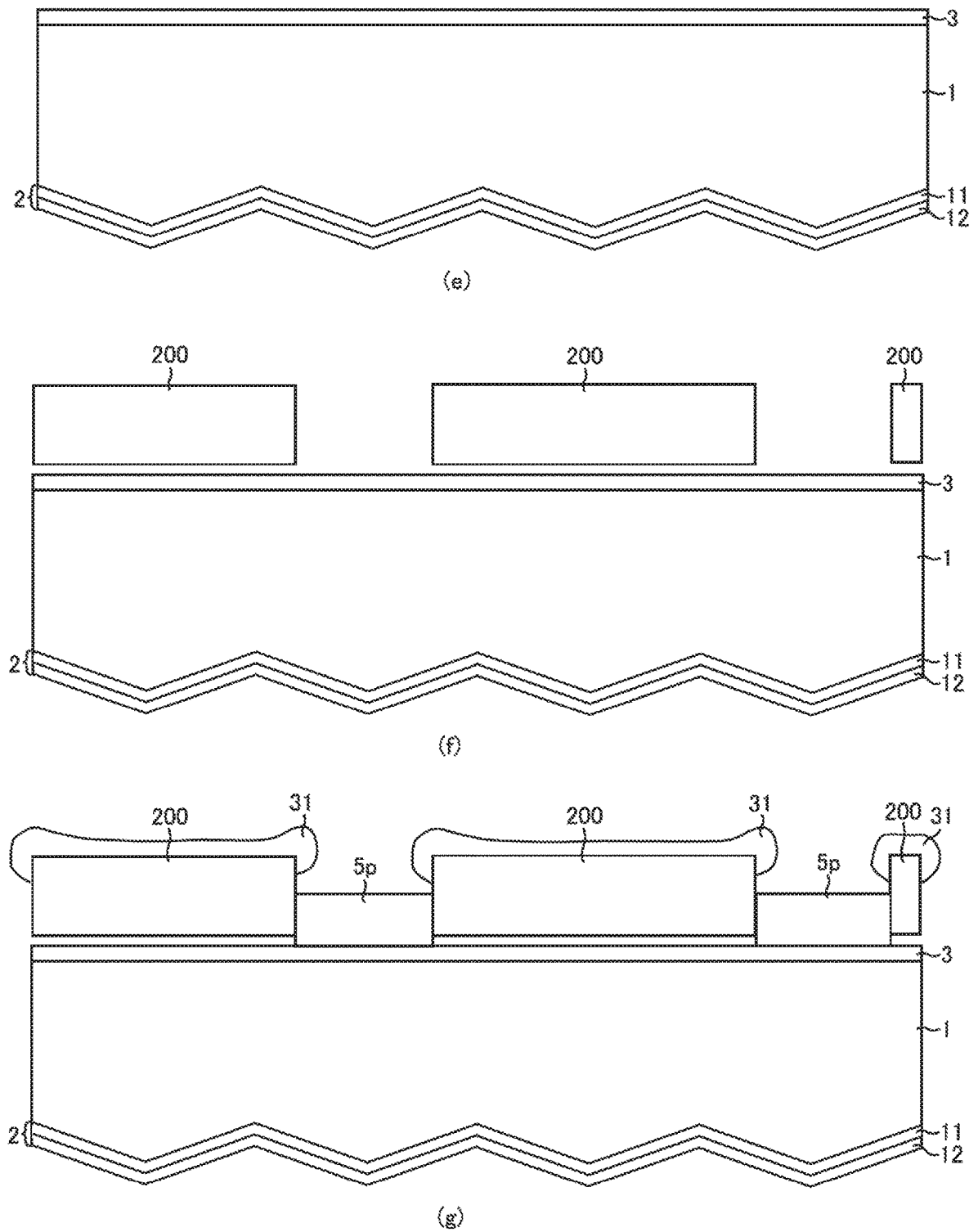
FIG. 12 is a second manufacturing step diagram illustrating the method of manufacturing the photovoltaic conversion device shown in FIG. 1.

Following the step shown in (e) of FIG. 12, the semiconductor substrate 1 is put in a reaction chamber of a plasma device, and the metal mask 200 is placed over the passivation film 3 of the semiconductor substrate 1 (see the step shown in (f) of FIG. 12).

The temperature of the semiconductor substrate 1 is set to 150 to 210° C. Hydrogen ($H_2$) gas, $SiH_4$ gas, and diborane ($B_2H_6$) gas are fed to the reaction chamber at 0 to 100 sccm, 40 sccm, and 40 sccm respectively, and the pressure inside the reaction chamber is set to 40 to 120 Pa. Thereafter, high-frequency electric power (13.56 MHz) with an RF power density of 5 to 15 mW/cm$^2$ is applied to parallel planar electrodes. The $B_2H_6$ gas is diluted with hydrogen to a concentration of, for example, 2%.

This procedure deposits p-type amorphous silicon on areas of the passivation film 3 that are not covered with the metal mask 200, thereby forming the p-type amorphous semiconductor strips 5p on the passivation film 3 (see the step shown in (g) of FIG. 12). In the current case, n-type amorphous silicon 31 deposits also on the metal mask 200.

Figure 13:
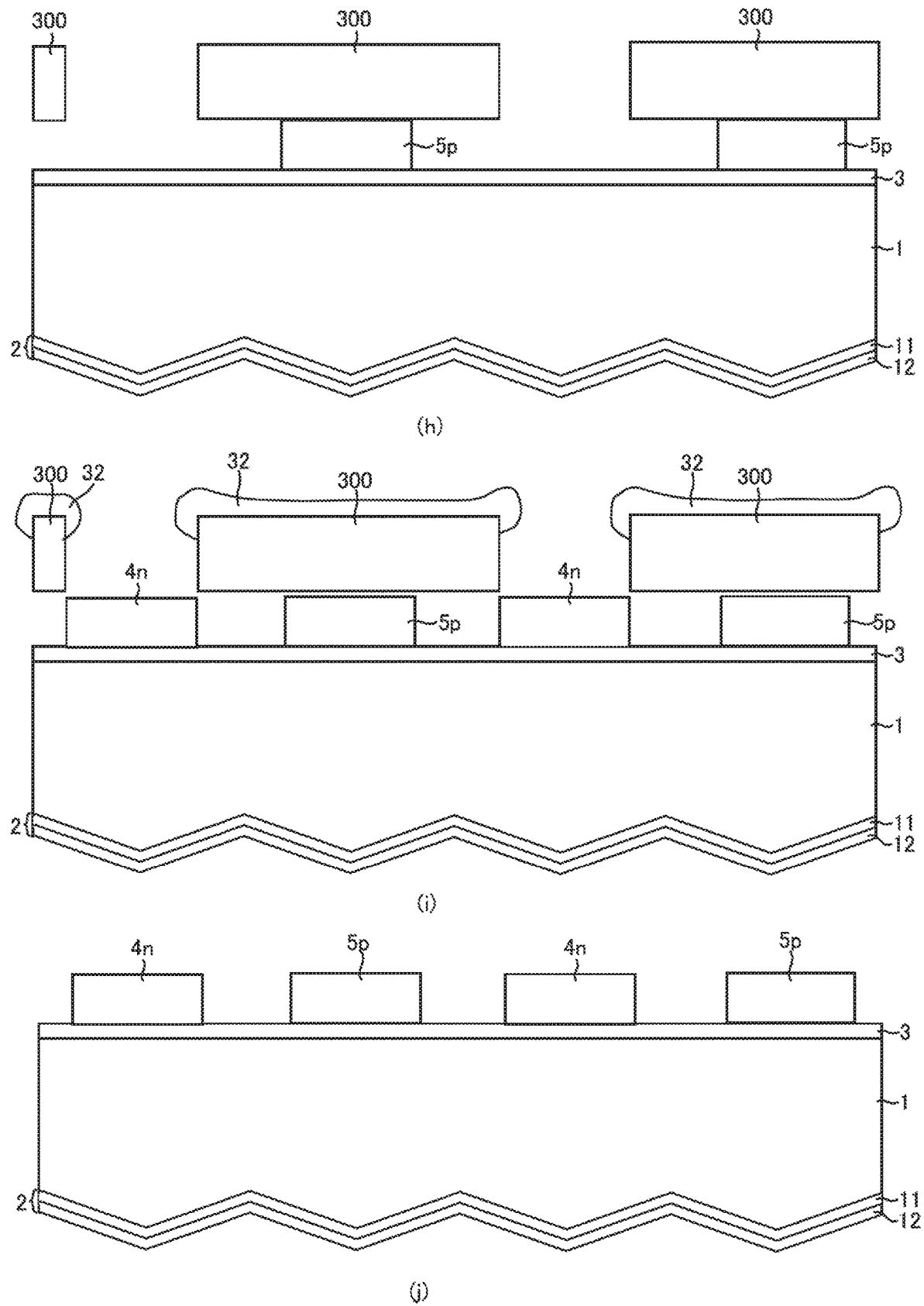
FIG. 13 is a third manufacturing step diagram illustrating the method of manufacturing the photovoltaic conversion device shown in FIG. 1.

After the step shown in (g) of FIG. 12, the metal mask 300 is placed over the passivation film 3 and the p-type amorphous semiconductor strips 5p in place of the metal mask 200 (see the step shown in (h) of FIG. 13).

The metal mask 300 is shown at a distance from the passivation film 3 in the step shown in (h) of FIG. 13. The metal mask 300 is in practice placed very proximate to the passivation film 3 because the p-type amorphous semiconductor strips 5p are, as mentioned earlier, as thin as 5 to 20 nm.

Then, the temperature of the semiconductor substrate 1 is set to approximately 170° C. $H_2$ gas, $SiH_4$ gas, and phosphine ($PH_3$) gas are fed to the reaction chamber at 0 to 100 sccm, 40 sccm, and 40 sccm respectively. The pressure inside the reaction chamber is set to 40 to 200 Pa. Thereafter, high-frequency electric power (13.56 MHz) with an RF power density of approximately 8.33 mW/cm$^2$ is applied to parallel planar electrodes. The $PH_3$ gas is diluted with hydrogen to a concentration of, for example, 1%.

This procedure deposits n-type amorphous silicon on areas of the passivation film 3 that are not covered by the metal mask 300, thereby forming the n-type amorphous semiconductor strips 4n on the passivation film 3 (see the step shown in (i) of FIG. 13). In the current case, n-type amorphous silicon 32 deposits also on the metal mask 300.

After the n-type amorphous semiconductor strips 4n are formed by deposition, the metal mask 300 is removed, Which leaves the n- and p-type amorphous semiconductor strips 4n and 5p formed on the passivation film 3 alternately as viewed along an in-plane direction of the semiconductor substrate 1 (see the step shown in (j) of FIG. 13).

Figure 14:
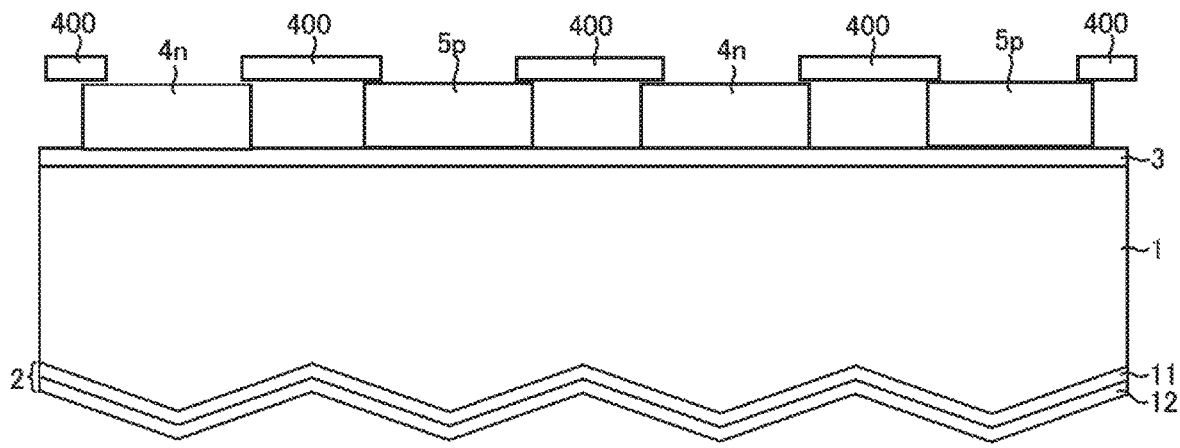
FIG. 14 is a fourth manufacturing step diagram illustrating the method of manufacturing the photovoltaic conversion device shown in FIG. 1.
Figure 14:
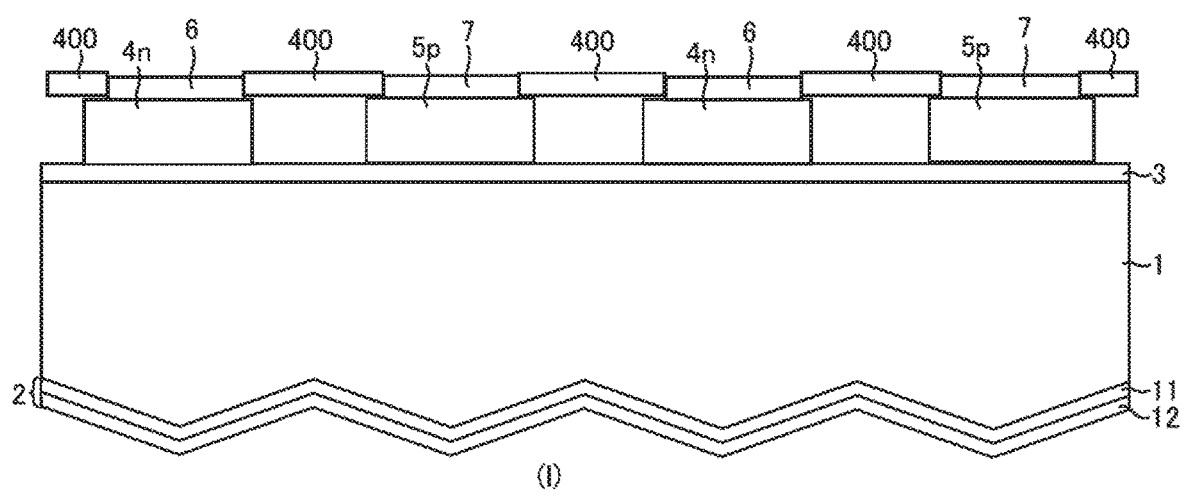
Figure 14:
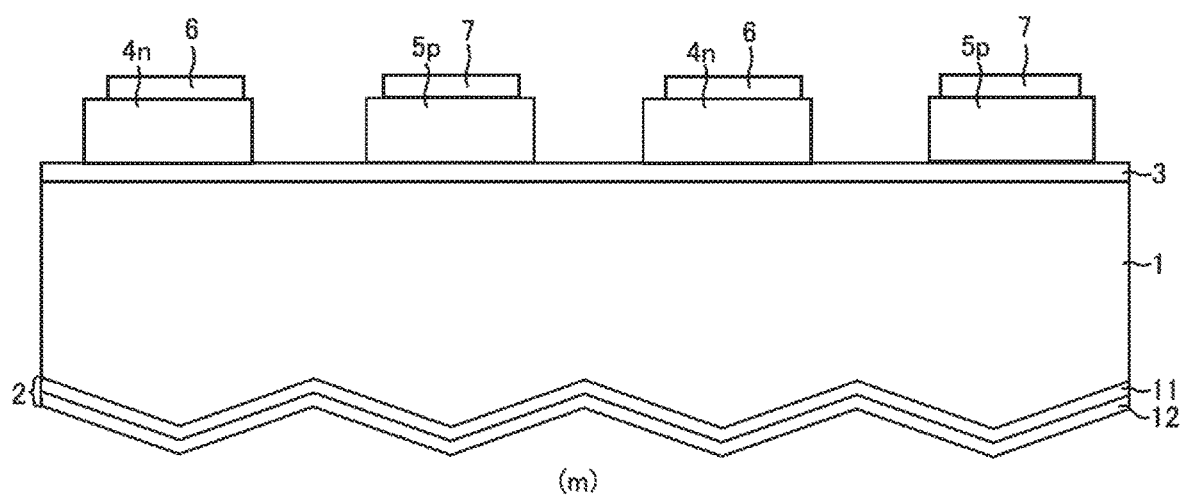

After the step shown in (j) of FIG. 13, the metal mask 400 is placed such that the openings 401n and 401p are positioned respectively above the n- and p-type amorphous semiconductor strips 4n and 5p (see the step shown in (k) of FIG. 14).

The electrodes 6 and 7 are then formed respectively on the n- and p-type amorphous semiconductor strips 4n and 5p via the metal mask 400 (see the step shown in (l) of FIG. 14). The electrodes 6 and 7 have a thickness of preferably 50 nm to 1 μm and more preferably 50 nm to 500 nm. The electrodes 6 and 7, if having an increased thickness, exert increased stress on the semiconductor substrate 1 and hence cause the semiconductor substrate 1 to warp.

This completes the manufacture of the photovoltaic conversion device 10 (step (m) of FIG. 14).

In this method of manufacturing the photovoltaic conversion device 10, the n- and p-type amorphous semiconductor strips 4n and 5p may not overlap each other and may partially overlap each other.

If the n- and p-type amorphous semiconductor strips 4n and 5p do not overlap, the n- and p-type amorphous semiconductor strips 4n and 5p are separated by a distance K. The distance K is, for example, approximately 0 to 100 μm. The regions between the n- and p-type amorphous semiconductor strips 4n and 5p are passivated with the passivation film 3, so that very few of the carriers produced in the semiconductor substrate 1 disappear. If the passivation film 3 is exposed, the properties of the passivation film 3 deteriorates gradually during or after manufacture. Therefore, it is preferable that the n- and p-type amorphous semiconductor strips 4n and 5p overlap each other or that the passivation film 3 be protected by a protection layer such as a silicon oxide film.

If the n- and p-type amorphous semiconductor strips 4n and 5p partially overlap, overlap regions where the n- and p-type amorphous semiconductor strips 4n and 5p partially overlap are formed between the n- and p-type amorphous semiconductor strips 4n and 5p. However, since the n- and p-type amorphous semiconductor strips 4n and 5p have a low conductivity, no electric current flows between the n- and p-type amorphous semiconductor strips 4n and 5p, causing no short circuit in the p-n junctions.

The reduced-thickness regions 41 and 51 have so far been described as being formed in both the n- and p-type amorphous semiconductor strips 4n and 5p. Embodiment 1 is by no means limited to this configuration. Reduced-thickness regions need to be formed at least either in the n-type amorphous semiconductor strips 4n or in the p-type amorphous semiconductor strips 5p.

The carriers (electrons and holes) produced in the semiconductor substrate 1 have a diffusion length of approximately 2 mm. If the length in the X-axis direction of the reduced-thickness regions 51 in the p-type amorphous semiconductor strips 5p is larger than the diffusion length (approximately 2 mm) of the carriers (electrons and holes), the carriers disappear between the p-type amorphous semiconductor strips 5p and the p-type amorphous semiconductor strips 102p, thereby decreasing photoelectric conversion efficiency. However, in Embodiment 1, the length of the reduced-thickness regions 51 in the X-axis direction is less than or equal to so that the carriers do not disappear, thereby improving photoelectric conversion efficiency.

As mentioned earlier, the photovoltaic conversion device 10 includes: the n-type amorphous semiconductor sections 4 including at least one n-type amorphous semiconductor strip 4n having the reduced-thickness regions 41 at desired intervals as traced along the length direction; the p-type amorphous semiconductor sections 5 including at least one p-type amorphous semiconductor strip 5p having the reduced-thickness regions 51 at desired intervals as traced along the length direction; the electrodes 6 arranged on the n-type amorphous semiconductor strips 4n; and the electrodes 7 arranged on the p-type amorphous semiconductor strips 5p. No electrodes are disposed in the segments of the reduced-thickness regions 41 in the n-type amorphous semiconductor strips 4n where the curvature r is positive with respect to the length direction and in the segments of the reduced-thickness regions 51 in the p-type amorphous semiconductor strips 5p where the curvature r is positive with respect to the length direction.

In the segments where the curvature r is positive, the conductive layer as a reduced thickness, and therefore open-circuit voltage is low. If these segments were connected to the electrodes, the photovoltaic conversion device would exhibit deteriorated properties. In the photovoltaic conversion device 10, no electrodes are provided in segments where the curvature r is positive. The properties therefore do not deteriorate.

Since there is a conductive layer in the reduced-thickness regions, carrier lifetime does not decrease, and carriers are thereby efficiently collected by the electrodes, due to an electric-field-passivation effect by the conductive semiconductor layers as well as due to the chemical passivation effect by the passivation layer 3.

Therefore, the photovoltaic conversion device 10 can exhibit improved conversion efficiency.

If the passivation layer 3 is exposed, the properties thereof deteriorate gradually during or after manufacture. In the photovoltaic conversion device 10, the passivation layer 3 is covered with a conductive layer. Properties are therefore less likely to deteriorate. Although it may be possible to cover the passivation layer 3 with an insulating layer, the electric-field-passivation effect by the conductive layer will be lost, and an additional mask will be needed, which increases the manufacturing steps and cost. The photovoltaic conversion device 10 exhibits good properties and also requires fewer manufacturing steps and less cost. By performing half etching in a process using metal masks, the opening regions can be divided, which in turn lowers the aspect ratio (ratio of the lengths of the long and short sides) of the openings. This configuration can enhance the mechanical strength of the metal mask, and even when the metal mask is washed or heated, restrain the metal mask from warping. That in turn leads to the formation of a good pattern, the mask's improved durability, and cost cuts.

As mentioned earlier, the metal masks 200, 300, and 400, used in the manufacture of the photovoltaic conversion device 10, have the respective openings 201A, 301A, 401n, and 401p which have an aspect ratio of less than or equal to 300. Therefore, when the metal masks 200, 300, and 400 are attached intimately to the semiconductor substrate 1 using a magnetic field, the metal masks 200, 300, and 400 are less likely to warp under the influence of the magnetic field. The metal masks 200, 300, and 400 can be attached intimately to the semiconductor substrate 1 with a satisfactory level of precision.

As a result, the n- and p-type amorphous semiconductor strips 4n and 5p and the electrodes 6 and 7 can be formed in desired shapes using the metal masks 200, 300, and 400.

Embodiment 2

Figure 15:
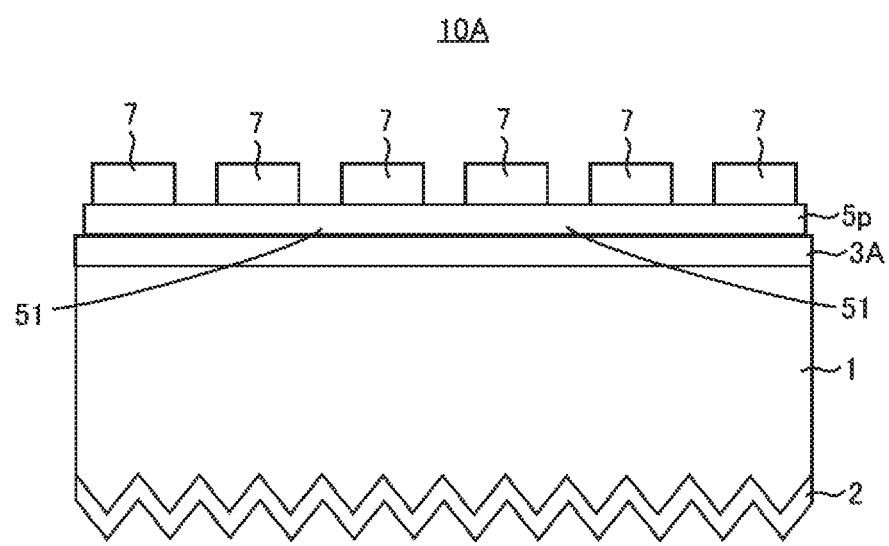
FIG. 15 is a schematic view of a structure of a photovoltaic conversion device in accordance with Embodiment 2.

FIG. 15 is a schematic view of a structure of a photovoltaic conversion device in accordance with Embodiment 2. Referring to FIG. 15, a photovoltaic conversion device 10A in accordance with Embodiment 2 is identical to the photovoltaic conversion device 10 except that the photovoltaic conversion device 10A includes a passivation film 3A in place of the passivation film 3 of the photovoltaic conversion device 10 shown in FIGS. 1 and 2.

The passivation film 3A is composed of an i-type amorphous semiconductor layer which is a hydrogen-containing, practically intrinsic amorphous semiconductor layer.

The i-type amorphous semiconductor layer is composed of, for example, an i-type amorphous silicon, an i-type amorphous silicon germanium, an i-type amorphous germanium, an i-type amorphous silicon carbide, an i-type amorphous silicon nitride, an i-type amorphous silicon oxynitride, an i-type amorphous silicon oxide, or an i-type amorphous silicon carbon oxide.

The passivation film 3A has a thickness of, for example, 1 to 10 nm.

If the passivation film 3A is an i-type amorphous semiconductor layer, the n- and p-type amorphous semiconductor strips 4n and 5p are formed at low temperature after the passivation film 3A is formed. The n- and p-type amorphous semiconductor strips 4n and 5p contain hydrogen and therefore provide a high passivation effect.

That enhances the electric-field-passivation effect by the reduced-thickness regions 41 and 51. The photovoltaic conversion device 10A hence has further improved conversion efficiency.

The photovoltaic conversion device 10A is manufactured by the same steps as steps (a) to (m) shown in FIGS. 11 to 14, except that step (d) is replaced by a step of forming the antireflective film 2 and also that step (e) is replaced by a step of forming the passivation film 3A.

The passivation film 3A is formed as follows. An i-type amorphous semiconductor layer as the passivation film 3A is formed by plasma CVD.

More specifically, an i-type amorphous semiconductor layer is deposited by plasma CVD under the following conditions: the temperature of the substrate is 130 to 210° C., the flow rate of hydrogen gas is 0 to 100 sccm, the flow rate of silane gas is 40 sccm, pressure is 40 to 120 Pa, and RF power density is 5 to 15 mW/cm$^2$.

The photovoltaic conversion device 10A achieves a further improved passivation effect and can for this reason exhibit a higher conversion efficiency than the photovoltaic conversion device 10.

Embodiment 2, unless specifically described above, is the same as Embodiment 1.

Embodiment 3

Figure 16:
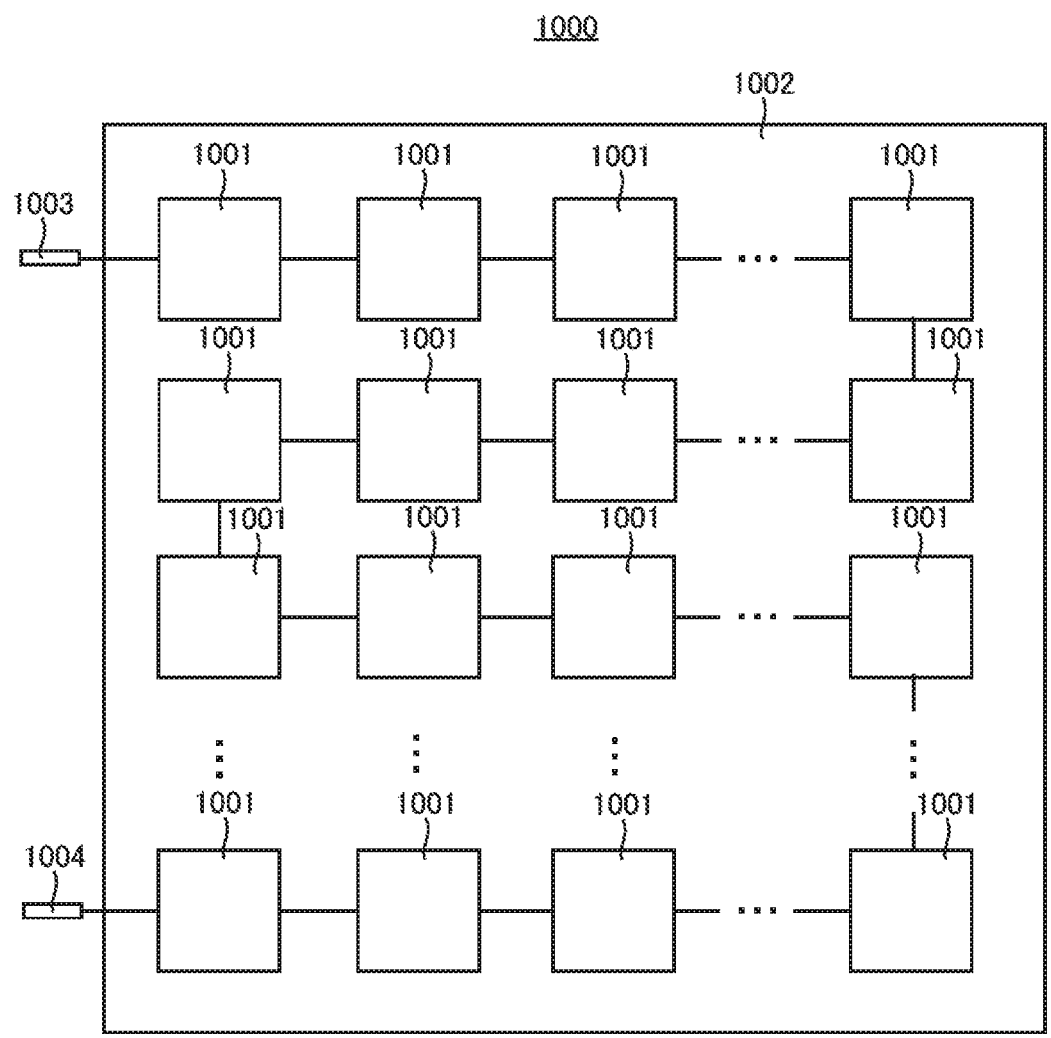
FIG. 16 is a schematic diagram showing a configuration of a photovoltaic module including photovoltaic conversion devices in accordance with the present embodiment.

FIG. 16 is a schematic diagram showing a configuration of a photovoltaic module including photovoltaic conversion devices in accordance with the present embodiment. Referring to FIG. 16, a photovoltaic module 1000 includes a plurality of photovoltaic conversion devices 1001, an enclosure 1002, and output terminals 1003 and 1004.

The photovoltaic conversion devices 1001 are arranged in an array and connected in series. The photovoltaic conversion devices 1001 may be connected in parallel or connected in series and in parallel, instead of being connected in series.

Each photovoltaic conversion device 1001 is constituted by one of the photovoltaic conversion devices 10 and 10A.

The enclosure 1002 is composed of a weather resistant enclosure and houses the photovoltaic conversion devices 1001. The enclosure 1002 includes, tor example, a transparent base member (e.g., glass) provided so as to face the light-receiving faces of the photovoltaic conversion devices 1001, a back-face base member (e.g., glass or resin sheet) provided so as to face the hack faces (opposite the light-receiving faces) of the photovoltaic conversion devices 1001, and a sealing member EVA) sealing the gaps between the transparent base member and the back-face base member.

The output terminal 1003 is connected to one of the series-connected photovoltaic conversion devices 1001 that is located at one end of the series.

The output terminal 1004 is connected to one of the series-connected photovoltaic conversion devices 1001 that is located at the other end of the series.

As mentioned earlier, the photovoltaic conversion devices 10 and 10A exhibit excellent conversion efficiency.

Therefore, the photovoltaic module 1000 exhibits improved conversion efficiency.

The number of the photovoltaic conversion devices 1001 contained in the photovoltaic module 1000 may be equal to any integer greater than 1.

The photovoltaic module in accordance with Embodiment 3 is by no means limited to the configuration shown in FIG. 16 and may have any configuration so long as either the photovoltaic conversion devices 10 or 10A are used.

Embodiment 4

Figure 17:
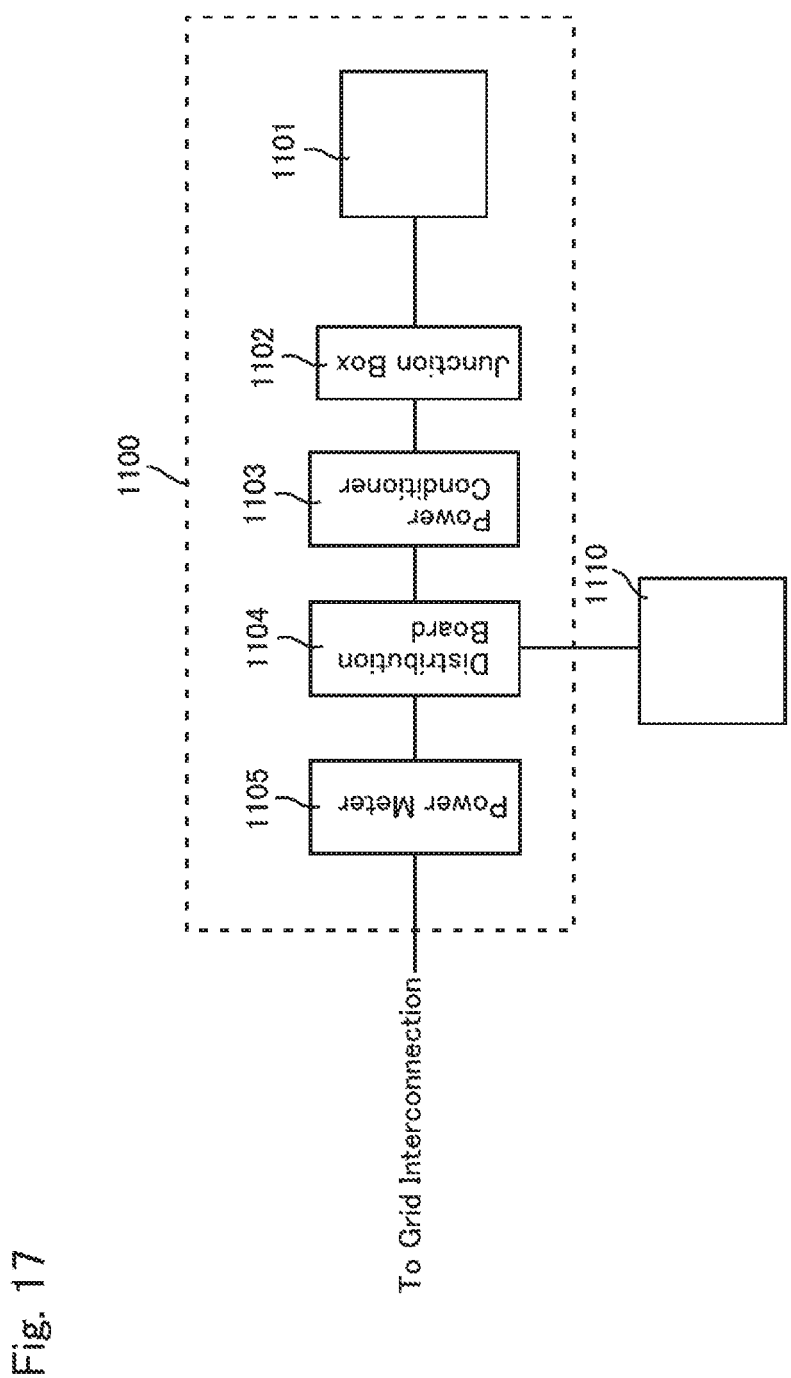
FIG. 17 is a schematic diagram showing a configuration of a solar power generation system including photovoltaic conversion devices in accordance with the present embodiment.

FIG. 17 is a schematic diagram showing a configuration of a solar power generation system including photovoltaic conversion devices in accordance with the present embodiment.

Referring to FIG. 17, a solar power generation system 1100 includes a photovoltaic module array 1101, a junction box 1102, a power conditioner 1103, a distribution board 1104, and a power meter 1105.

The junction box 1102 is connected to the photovoltaic module array 1101. The power conditioner 1103 is connected to the junction box 1102. The distribution board 1104 is connected to the power conditioner 1103 and an electric device 1110. The power meter 1105 is connected to the distribution board 1104 and a grid interconnection.

The photovoltaic module array 1101 converts sunlight to electricity to generate DC power and supplies the generated DC power to the junction box 1102.

The junction box 1102 receives the DC power generated by the photovoltaic module array 1101 and supplies the received DC power to the power conditioner 1103.

The power conditioner 1103 converts the DC power received from the junction box 1102 to AC power and supplies the resulting AC power to the distribution board 1104.

The distribution board 1104 supplies the AC power received from the power conditioner 1103 and/or the commercial power received via the power meter 1105 to the electric device 1110. If the AC power received from the power conditioner 1103 is larger than the power consumption of the electric device 1110, the distribution board 1104 supplies remaining AC power to the grid interconnection via the power meter 1105.

The power meter 1105 measures the amount of power that is directed from the grid interconnection to the distribution board 1104 and measures the amount of power that is directed from the distribution board 1104 to the grid interconnection.

Figure 18:
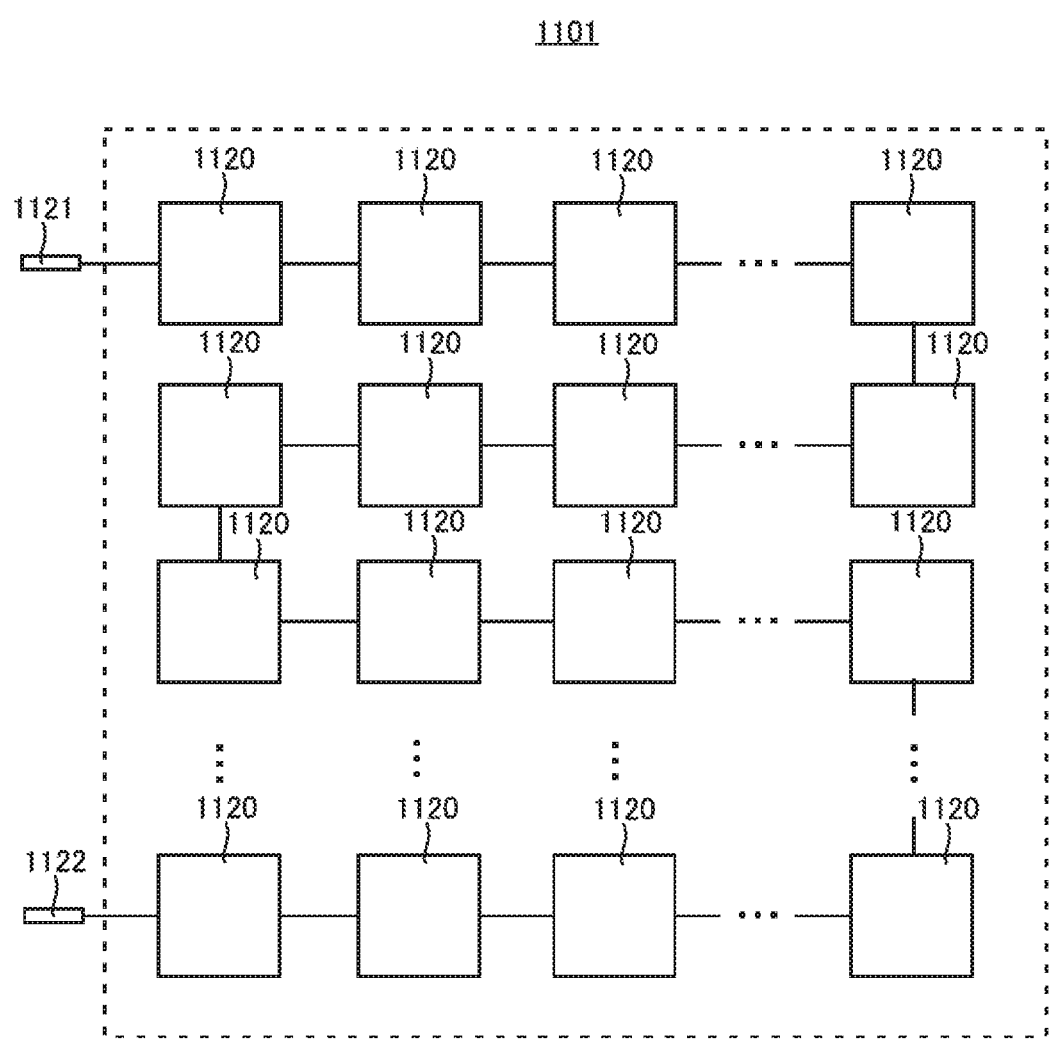
FIG. 18 is a schematic diagram showing a configuration of the photovoltaic module array shown in FIG. 17.

FIG. 18 is a schematic diagram showing a configuration of the photovoltaic module array 1101 shown in FIG. 17.

Referring to FIG. 18, the photovoltaic module array 1101 includes a plurality of photovoltaic modules 1120 and output terminals 1121 and 1122.

The photovoltaic modules 1120 form an array and are connected in series. The photovoltaic modules 1120 may be connected in parallel or connected in series and in parallel, instead of being connected in series. Each photovoltaic module 1120 is constituted by the photovoltaic module 1000 shown in FIG. 16.

The output terminal 1121 is connected to one of the series-connected photovoltaic modules 1120 that is located at one end of the series.

The output terminal 1122 is connected to one of the series-connected photovoltaic modules 1120 that is located at the other end of the series.

The number of the photovoltaic modules 1120 contained in the photovoltaic module array 1101 may be equal to any integer greater than 1.

The operation of the solar power generation system 1100 will be now described. The photovoltaic module array 1101 converts sunlight to electricity to generate DC power and supplies the generated DC power to the power conditioner 1103 via the junction box 1102.

The power conditioner 1103 converts the DC power received from the photovoltaic module array 1101 to AC power and supplies the resulting AC power to the distribution board 1104.

If the AC power received from the power conditioner 1103 is greater than or equal to the power consumption of the electric device 1110, the distribution board 1104 supplies the AC power received from the power conditioner 1103 to the electric device 1110. Then, the distribution board 1104 supplies remaining AC power to the grid interconnection via the power meter 1105.

If the AC power received from the power conditioner 1103 is less than the power consumption of the electric device 1110, the distribution board 1104 supplies the AC power received from the grid interconnection and the AC power received from the power conditioner 1103 to the electric device 1110.

As mentioned earlier, the solar power generation system 1100 includes either the photovoltaic conversion devices 10 or 10A which have excellent conversion efficiency.

Therefore, the solar power generation system 1100 exhibits improved conversion efficiency.

Figure 19:
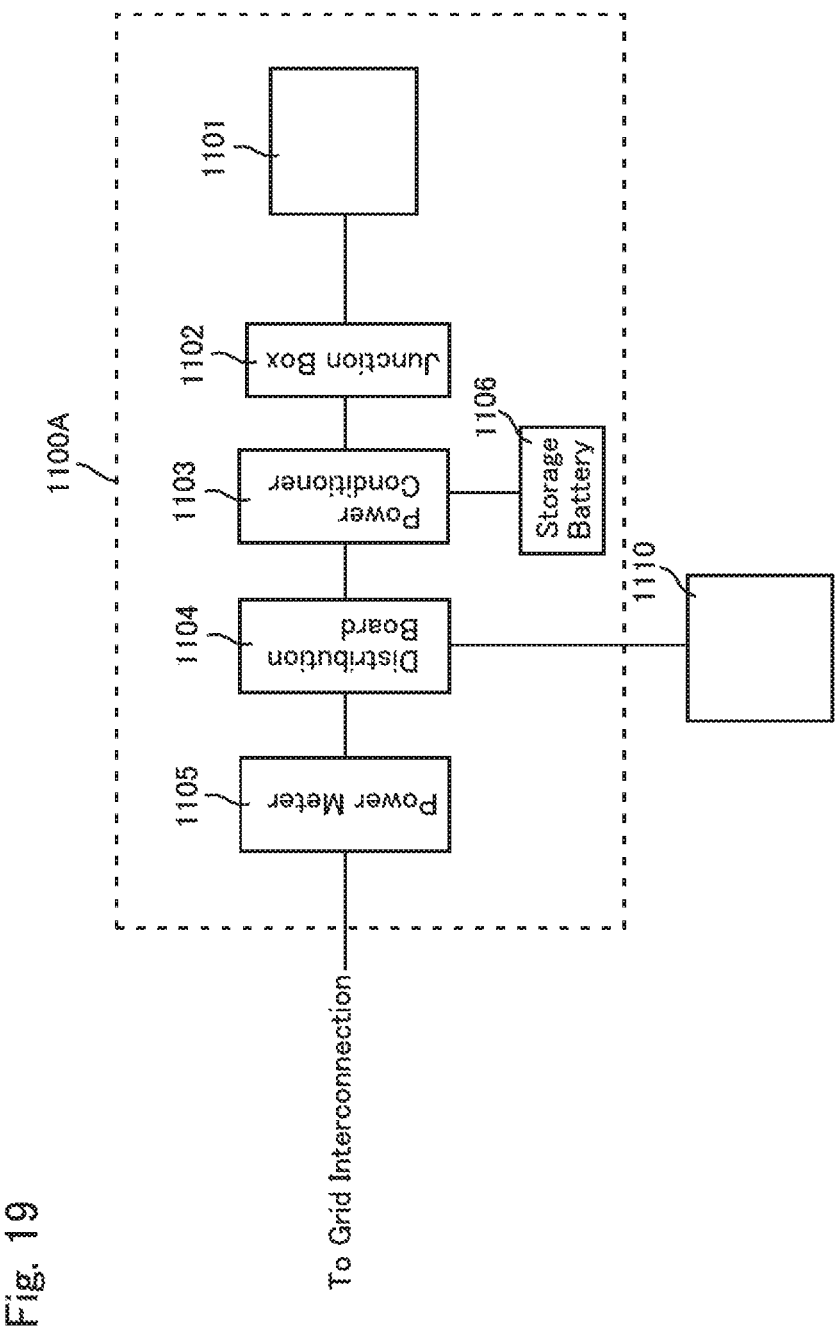
FIG. 19 is a schematic diagram showing a configuration of another solar power generation system including photovoltaic conversion devices in accordance with the present embodiment.

FIG. 19 is a schematic diagram showing a configuration of another solar power generation system including photovoltaic conversion devices in accordance with the present embodiment.

The solar power generation system including photovoltaic conversion devices in accordance with the present embodiment may be a solar power generation system 1100A shown in FIG. 19.

Referring to FIG. 19, the solar power generation system 1100A is the same as the solar power generation system 1100 shown in FIG. 17, except that the solar power generation system 1100A additionally includes a storage battery 1106.

The storage battery 1106 is connected to the power conditioner 1103.

In the solar power generation system 1100A, the power conditioner 1103 modifies some or all of the DC power received from the junction box 1102 in a manner suited to storage of power in the storage battery 1106.

The power conditioner 1103 otherwise operates in the same manner as in the solar power generation system 1100.

The storage battery 1106 stores the DC power received from the power conditioner 1103. The storage battery 1106 also supplies the stored power to the power conditioner 1103 in a suitable manner in accordance with the changing power generation by the photovoltaic module array 1101 and/or the changing power consumption of the electric device 1110.

The solar power generation system 1100A includes the storage battery 1106 as detailed above. This makes it possible to reduce output variations caused by variations in solar radiation and to supply power accumulated in the storage battery 1106 to the electric device 1110 during the time periods in which there is no sunshine.

The storage battery 1106 may be incorporated into the power conditioner 1103.

Figure 20:
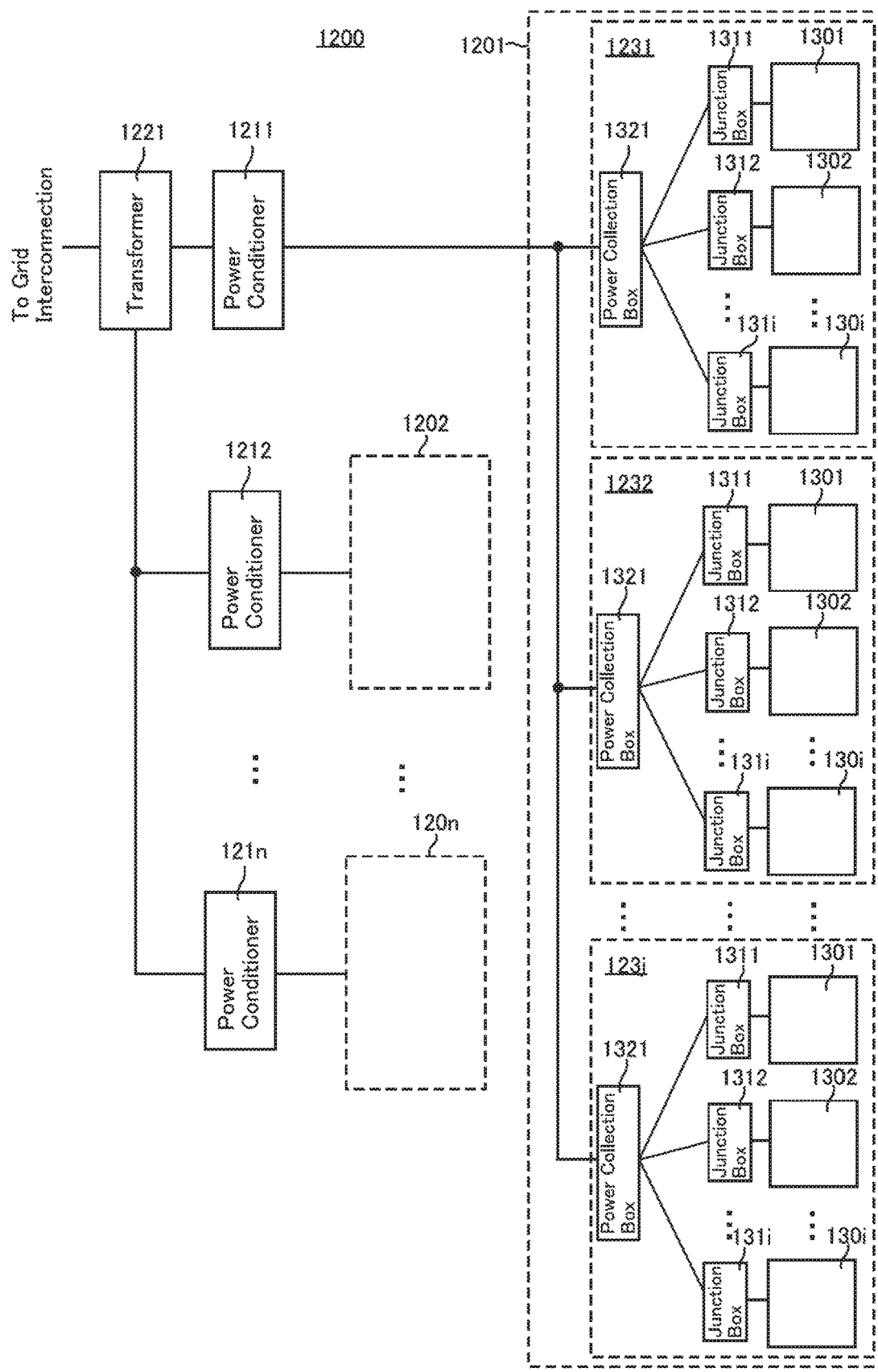
FIG. 20 is a schematic diagram showing a configuration of a solar power generation system including photovoltaic conversion devices in accordance with the present embodiment.

The solar power generation system in accordance with Embodiment 4 is by no means limited to the configurations shown in FIGS. 19 and 20 or the configurations shown in FIGS. 18 and 19 and may have any configuration as far as either the photovoltaic conversion devices 10 or 10A are used.

Embodiment 5

FIG. 20 is a schematic diagram showing a configuration of a solar power generation system including photovoltaic conversion devices in accordance with the present embodiment.

Referring to FIG. 20, a solar power generation system 1200 includes subsystems 1201 to 120n (n is an integer greater than 1), power conditioners 1211 to 121n, and a transformer 1221. The solar power generation system 1200 is of a larger scale than the solar power generation systems 1100 and 1100A shown respectively in FIGS. 17 and 19.

The power conditioners 1211 to 121n are connected to the respective subsystems 1201 to 120n.

The transformer 1221 is connected to the power conditioners 1211 to 121n and a grid interconnection.

Each subsystem 1201 to 120n is composed of module systems 1231 to 123j (j is an integer greater than 1).

Each module system 1231 to 123j includes photovoltaic module arrays 1301 to 130i (i is an integer greater than 1), junction boxes 1311 to 131i, and a power collection box 1321.

Each photovoltaic module array 1301 to 130i has the same configuration as the photovoltaic module array 1101 shown in FIG. 18.

The junction boxes 1311 to 131i are connected to the respective photovoltaic module arrays 1301 to 130i.

The power collection box 1321 is connected to the junction boxes 1311 to 131i. The j power collection boxes 1321 in the subsystem 1201 are connected to the power conditioner 1211. The j power collection boxes 1321 in the subsystem 1202 are connected to the power conditioner 1212. Other power collection boxes are connected to other power conditioners in a similar manner, and the j power collection boxes 1321 in the subsystem 120n are connected to the power conditioner 121n.

The i photovoltaic module arrays 1301 to 130i in the module system 1231 convert sunlight to electricity to generate DC power and supply the generated DC power to the power collection box 1321 via the respective junction boxes 1311 to 131i. The i photovoltaic module arrays 1301 to 130i in the module system 1232 convert sunlight to electricity to generate DC power and supply the generated DC power to the power collection box 1321 via the respective junction boxes 1311 to 131i. Other photovoltaic module arrays operate in a similar manner, and the i photovoltaic module arrays 1301 to 130i in the module system 123j convert sunlight to electricity to generate DC power and supply the generated DC power to the power collection box 1321 via the respective junction boxes 1311 to 131i.

Then, the j power collection boxes 1321 in the subsystem 1201 supply DC power to the power conditioner 1211.

In a similar manner, the j power collection boxes 1321 in the subsystem 1202 supply DC power to the power conditioner 1212.

Other power collection boxes operate in a similar manner, and the j power collection boxes 1321 in the subsystem 120n supply DC power to the power conditioner 121n.

The power conditioners 1211 to 121n convert the DC power received from the respective subsystems 1201 to 120n to AC power and supply the resulting AC power to the transformer 1221.

The transformer 1221 receives AC power from the power conditioners 1211 to 121n, adjusts the voltage level of the received AC power, and supplies the resulting AC power to the grid interconnection.

As mentioned earlier, the solar power generation system 1200 includes either the photovoltaic conversion devices 10 or 10A which have excellent conversion efficiency.

Therefore, the solar power generation system 1200 exhibits improved conversion efficiency.

Figure 21:
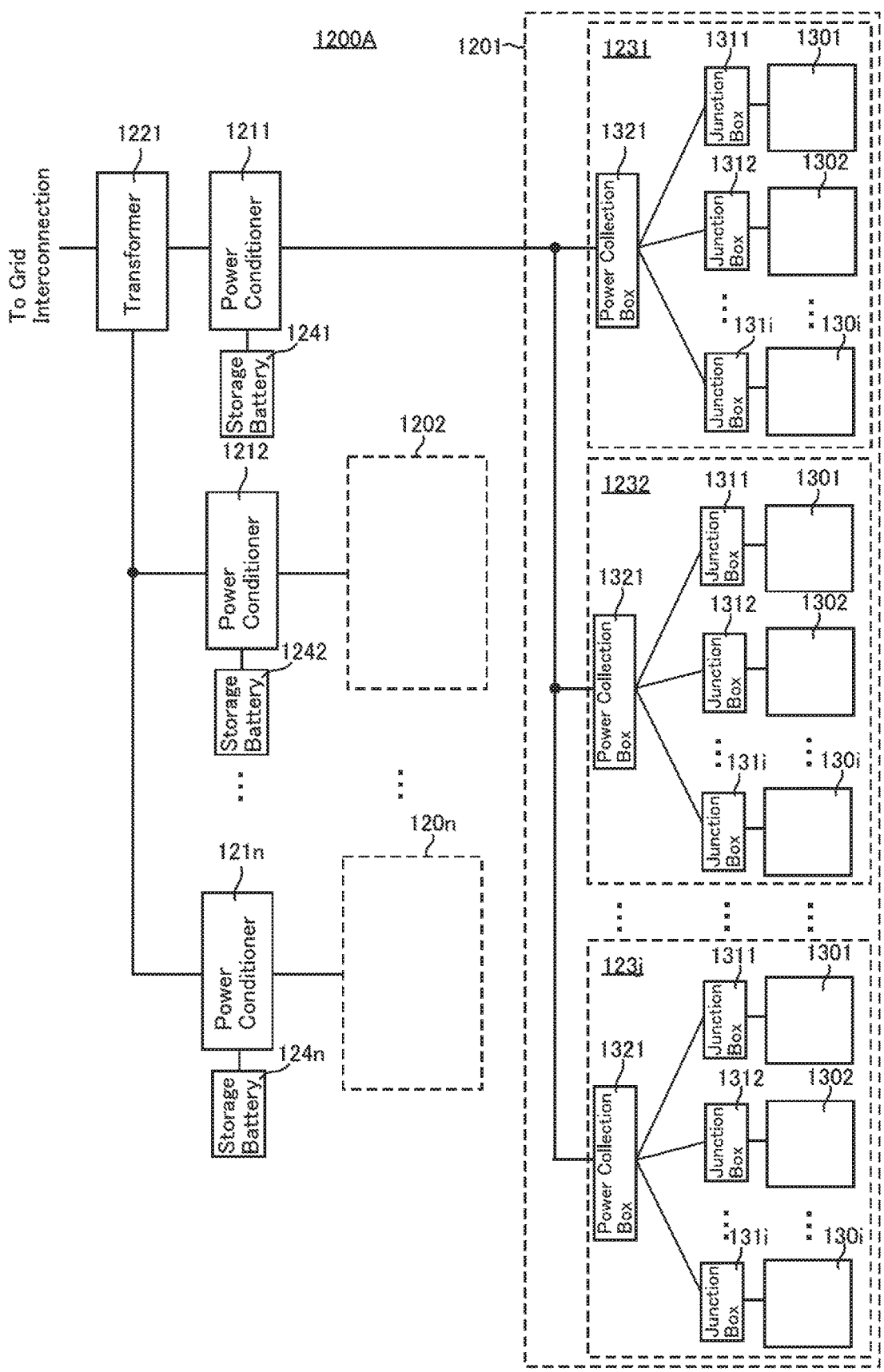
FIG. 21 is a schematic diagram showing a configuration of another solar power generation system including photovoltaic conversion devices in accordance with the present embodiment.

FIG. 21 is a schematic diagram showing a configuration of another solar power generation system including photovoltaic conversion devices in accordance with the present embodiment.

The solar power generation system including photovoltaic conversion devices in accordance with the present embodiment may be a solar power generation system 1200A shown in FIG. 21.

Referring to FIG. 21, the solar power generation system 1200A is the same as the solar power generation system 1200 shown in FIG. 20, except that the solar power generation system 1200A additionally includes storage batteries 1241 to 124n.

The storage batteries 1241 to 124n are connected respectively to the power conditioners 1211 to 121n.

In the solar power generation system 1200A, the power conditioners 1211 to 121n convert the DC power received respectively from the subsystems 1201 to 120n to AC power and supply the resulting AC power to the transformer 1221. The power conditioners 1211 to 121n also modifies the DC power received respectively from the subsystems 1201 to 120n in a manner suited to storage of power in the respective storage batteries 1241 to 124n.

The storage batteries 1241 to 124n supply the stored power to the respective power conditioners 1211 to 121n in accordance with the DC power supplied from the subsystems 1201 to 120n respectively.

The solar power generation system 1200A includes the storage batteries 1241 to 124n as detailed above. This makes it possible to reduce output variations caused by variations in solar radiation and to supply power accumulated in the storage batteries 1241 to 124n to the transformer 1221 during the time periods in which there is no sunshine.

The storage batteries 1241 to 124n may be incorporated into the power conditioners 1211 to 121n respectively.

The solar power generation system in accordance with Embodiment 5 is by no means limited to the configurations shown in FIGS. 20 and 21 and may have any configuration as far as either the photovoltaic conversion devices 10 or 10A are used.

Furthermore, in Embodiment 5, not all the photovoltaic conversion devices in the solar power generation systems 1200 and 1200A need to be the photovoltaic conversion devices 10 or 10A in accordance with Embodiment 1 or 2 respectively.

As such an example, all the photovoltaic conversion devices in a subsystem one of the subsystems 1201 to 120n) may be the photovoltaic conversion devices 10 or 10A in accordance with Embodiment 1 or respectively, whereas some or all the photovoltaic conversion devices in another subsystem (i.e., another one of the subsystems 1201 to 120*n*) may be photovoltaic conversion devices other than the photovoltaic conversion devices 10 and 10A.

VARIATION EXAMPLES

Embodiments 1 and 2 described the photovoltaic conversion devices 10 and 10A, and Embodiments 3 to 5 described photovoltaic modules and solar power generation systems incorporating any photovoltaic conversion devices in accordance with Embodiments 1 and 2.

The photovoltaic conversion devices in accordance with the embodiments of the present invention are not limited to the description of the embodiments above and may be altered within the scope of the claims. Furthermore, a new technological feature may be created by combining different technological means disclosed in the embodiments.

(1) Embodiments 1 to 5 above described the semiconductor substrate 1 for photovoltaic conversion devices as being of n-type. The semiconductor substrate 1 may alternatively be of p-type.

(2) Embodiments 1 to 5 above described photovoltaic conversion devices as including an antireflective film 2 on the light-receiving face of the semiconductor substrate 1 as an example. Alternatively, no antireflective film 2 may be provided. Other alternatives are also possible. The antireflective film 2 may be replaced by an n$^+$ layer in which a high concentration n-type dopant is diffused. Between the light-receiving face of the semiconductor substrate 1 and the antireflective film 2, there may be provided an n$^+$ layer in which a high concentration n-type dopant is diffused. An i-type amorphous semiconductor layer and an n-type amorphous semiconductor layer may be sequentially formed between the semiconductor substrate 1 and the antireflective film 2.

(3) Embodiments 1 to 2 above described examples of photovoltaic conversion devices in which after the passivation film 3 or 3A is formed across the entire back face of the semiconductor substrate 1, p-type amorphous semiconductor strips and n-type amorphous semiconductor strips are formed in this sequence on the passivation film 3 or 3A. The sequence of forming the p- and n-type amorphous semiconductor strips is by no means limited to this. For example, the passivation films 3 or 3A may be formed, after which the n- and p-type amorphous semiconductor strips may be formed in this sequence on the passivation films 3 or 3A.

(4) Embodiments 1 to 5 above described photovoltaic conversion devices as having texture on the light-receiving face of the semiconductor substrate 1 as an example. Alternatively, the texture fray be formed on the back face of the semiconductor substrate 1.

EXAMPLES OF THE INVENTION

Example 1

In Example 1, a photovoltaic conversion device was manufactured in accordance with Embodiment 2, and its properties were evaluated. A specific description will be given of the manufacture.

First, a wafer with a thickness of 150 μm was cut out of 156-mm n-type bulk silicon. The wafer was then etched to remove damaged layers from the surface thereof and also adjust the thickness thereof. A protective film was then formed on one of these etched faces of the wafer. A silicon nitride film was formed as the protective film. The wafer on which the protective film had been formed was wet-etched in an aqueous solution of KOH (1 to 5 wt %) and isopropyl alcohol (1 to 10 wt %). The protective film was removed after the etching.

Subsequently, an antireflective film 2 composed of a silicon oxide film and a silicon nitride film would be formed on the light-receiving face of the semiconductor substrate 1. A surface of the semiconductor substrate 1 was first subjected to thermal oxidation to form an oxide film on the light-receiving face of the semiconductor substrate 1, and thereafter, a silicon nitride film was formed on the oxide film on the light-receiving face, so as to form the antireflective film 2.

Next, as a passivation film 3A, a 5-nm, hydrogen-containing, practically intrinsic amorphous silicon film was formed in a plasma CND device under the following conditions. Silane gas and hydrogen gas were introduced as reactant gases into the reaction chamber of the plasma CVD device. The temperature of the semiconductor substrate 1 was 200° C., the flow rate of the hydrogen gas was 100 sccm, the flow rate of the silane gas (SiH$_4$) was 40 sccm, the pressure inside the reaction chamber was 100 Pa, and the high-frequency (13.56 MHz) electric power density was 10 mW/cm$^2$.

Subsequently, a metal mask 200 was placed over the passivation film 3A, to form 10-nm, p-type amorphous semiconductor strips 5*p*.

In this example, the width of openings 201A in the metal mask 200 was 800 μm, the length thereof was 38 mm, and the width of the convex sections 201B was 200 μm.

The p-type amorphous semiconductor strips 5*p* were formed by plasma CVD under the following conditions. Silane gas, hydrogen gas, and hydrogen-diluted diborane gas (diborane concentration was 2%) were introduced as reactant gases into the reaction chamber of the plasma CVD device. The flow rate of the hydrogen gas was 100 sccm, the flow rate of the silane gas was 40 sccm, the flow rate of the diborane gas was 40 sccm, the temperature of the semiconductor substrate 1 was 200° C., the pressure inside the reaction chamber was 100 Pa, and the high-frequency electric power density was 10 mW/cm$^2$.

Subsequently, a metal mask 300 was placed over the passivation film 3A, to form 10-nm n-type amorphous semiconductor strips 4*n*.

In this example, the width of openings 301A in the metal mask 300 was 800 μm, the length thereof was 38 mm, and the width of the convex sections 301B was 200 μm.

The n-type amorphous semiconductor strips 4*n* were formed by plasma CVD under the following conditions. Silane gas, hydrogen gas, and hydrogen-diluted phosphine gas (phosphine concentration was, for example, 1%) were introduced as reactant gases into the reaction chamber of the plasma CVD device. The temperature of the semiconductor substrate 1 was 170° C., the flow rate of the hydrogen gas was 100 sccm, the flow rate of the silane gas was 40 sccm, the flow rate of the phosphine gas was 40 sccm, the pressure inside the reaction chamber was 40 Pa, and the high-frequency electric power density was 8.33 mW/cm$^2$.

Following the formation of the n-type amorphous semiconductor strips 4*n*, electrodes 6 and 7 would be formed respectively on the n- and p-type amorphous semiconductor strips 4*n* and 5*p*.

The electrodes 6 and 7 were formed by placing a metal mask 400 over the semiconductor substrate 1 and forming silver electrodes by sputtering. The metal mask 400 had openings 401*n* and 401*p* at intervals of 300 μm as measured along the length direction of the openings. Each opening 401n and 401p had a width of 700 μm and a length of 37.9 mm. The electrodes 6 and 7 were 200 nm thick.

A cross-section of the photovoltaic conversion device prepared in this manner was observed by TEM before a conductive section was formed. The observation showed that the n- and p-type amorphous semiconductor strips 4n and 5p respectively had reduced-thickness regions 41 and 51 each having a width of 150 μm. The reduced-thickness regions 41 and 51 were 1 nm thick where they were thinnest.

Dopant concentration in the reduced-thickness regions 41 and 51 was measured by SIMS. The reduced-thickness regions 51 of the p-type amorphous semiconductor strips 5p had a boron concentration of $1 \times 10^{20}$ atoms/cm$^{-3}$, and the reduced-thickness regions 41 of the n-type amorphous semiconductor strips 4n had a phosphorus concentration of $3 \times 10^{20}$ atoms/cm$^{-3}$.

Comparative Example 1

A photovoltaic conversion device was manufactured in the same manner as in Example 1, except that the metal masks 200 and 300 used had no convex sections 201B and 301B.

A cross-section of the photovoltaic conversion device prepared in this manner was observed by TEM before a conductive section was formed. The observation showed that the p- and n-type amorphous semiconductor strips were uniform and had no reduced-thickness regions. Visual observation showed that the semiconductor strips had non-uniform intervals.

Comparative Example 2

A photovoltaic conversion device was manufactured in the same manner as in Example 1, except that, the metal masks 200 and 300 used had convex sections 201B and 301B having the same thickness as the rest of the metal masks 200 and 300.

A cross-section of the photovoltaic conversion device prepared in this manner was observed by TEM before a conductive section was formed. The observation showed that the p- and n-type amorphous semiconductor strips were spaced apart. The dopant concentration in the spaces was measured by SIMS. The spaces between the p-type amorphous semiconductor strips had a boron concentration of $1 \times 10^{19}$ atoms/cm$^{-3}$ or less, and the spaces between the n-type amorphous semiconductor strips had a phosphorus concentration of $1 \times 10^{19}$ atoms/cm$^{-3}$ or less.

Comparative Example 3

A photovoltaic conversion device was manufactured in the same manner as in Example 1, except that the metal mask 400 used had a single continuous opening with no divisions along its length direction.

A cross-section of the photovoltaic conversion device prepared in this manner was observed by TEM before a conductive section was formed. The observation showed that the p- and n-type amorphous semiconductor strips had reduced-thickness regions each having a width of 150 μm. The reduced-thickness regions were 1 nm thick where they were thinnest. Electrodes were present on the reduced-thickness regions.

The dopant concentration in the reduced-thickness regions was measured by SIMS. The reduced-thickness regions of the p-type amorphous semiconductor strips had a boron concentration of $1 \times 10^{20}$ atoms/cm$^{-3}$, and the reduced-thickness regions of the n-type amorphous semiconductor strips had a phosphorus concentration of $3 \times 10^{20}$ atoms/cm$^{-3}$.

A conductive section was formed on these photovoltaic conversion devices using a wiring sheet 30, which completed the manufacture of the photovoltaic conversion devices.

The conversion efficiency of each photovoltaic conversion device manufactured was measured using s solar simulator. The conversion efficiency, relative to that of Example 1, was 0.93 in Comparative Example 1, 0.97 in Comparative Example 2, and 0.95 in Comparative Example 3. These results show that Example 1 delivers better properties than Comparative Examples 1 to 3.

The conversion efficiency of each photovoltaic conversion device was measured once again using s solar simulator after leaving the photovoltaic conversion device indoors for one month. The conversion efficiency, relative to that of Example 1, was 0.93 in Comparative Example 1, 0.94 in Comparative Example 2, and 0.94 in Comparative Example 3. These results show that Example 1 delivers better properties than Comparative Examples 1 to 3.

Example 2

A photovoltaic conversion device was manufactured in the same manner as in Example 1, except that the passivation film was changed to a 1-nm silicon oxide film. Measurement showed that this photovoltaic conversion device had substantially the same properties as the one manufactured in Example 1.

According to embodiments of the present invention, a photovoltaic conversion device has one of the following arrangements.

Arrangement 1

The present invention, in an embodiment thereof, is directed to a photovoltaic conversion device including a semiconductor substrate, a first amorphous semiconductor section, a second amorphous semiconductor section, a plurality of first electrodes, and a plurality of second electrodes. The semiconductor substrate is of a first conductivity type. The first amorphous semiconductor section is provided on one of faces of the semiconductor substrate and includes at least one first amorphous semiconductor strip of the first conductivity type. The second amorphous semiconductor section is provided on one of the faces of the semiconductor substrate and includes at least one second amorphous semiconductor strip of a second conductivity type that differs from the first conductivity type, the first and second amorphous semiconductor strips being arranged alternately as viewed along an in-plane direction of the semiconductor substrate. The first electrodes are arranged spaced apart from each other on the first amorphous semiconductor section. The second electrodes are arranged spaced apart from each other on the second amorphous semiconductor section. The first and second amorphous semiconductor strips each have at least one reduced-thickness region where that first or second amorphous semiconductor strip has a reduced thickness, the reduced-thickness region being provided across the first and second amorphous semiconductor strips in a width direction thereof. The reduced-thickness region has no electrodes formed in a segment thereof where the reduced-thickness region has a positive curvature with respect to a length direction of the first and second amorphous semiconductor strips.

In the segments where the curvature r is positive, the conductive layer has a reduced thickness, and therefore open-circuit voltage is low. If these segments were connected to the electrodes, the photovoltaic conversion device would exhibit deteriorated properties. In the photovoltaic conversion device in accordance with the embodiment of the present invention, no electrodes are provided in segments where the curvature r is positive. The properties therefore do not deteriorate.

Since there is a conductive layer in the reduced-thickness regions, the conductive semiconductor layers exhibit an electric-field-passivation effect, which in turn prevents carrier lifetime from decreasing and thereby contributes to efficient collection of carriers by the electrodes.

Therefore, the photovoltaic conversion device can exhibit improved conversion efficiency.

Arrangement 2

The photovoltaic conversion device according to arrangement 1 may further include a passivation film between the semiconductor substrate and the first and second amorphous semiconductor sections.

The passivation film has a chemical passivation effect. Thus, this arrangement restricts recombination of carriers at the interface between the semiconductor substrate and the passivation film, thereby achieving increased efficiency in the collection of carriers.

The arrangement can hence further improve the conversion efficiency of the photovoltaic conversion device.

Arrangement 3

The passivation film according to arrangement 2 may contain intrinsic hydrogenated amorphous silicon.

In a step that follows the formation of the passivation film, semiconductor layers are formed at a temperature approximately equal to the temperature at which the passivation film is formed. That reduces the thermal strain experienced by the semiconductor substrate, thereby suppressing the deterioration of properties of the semiconductor substrate. Also, the dangling bonds on the surface of the semiconductor substrate can be bonded to hydrogen atoms, which restricts recombination of carriers.

The photovoltaic conversion device can hence exhibit further improved conversion efficiency.

Arrangement 4

The reduced-thickness region according to any one of arrangements 1 to 3 may contain, in the segment thereof where the reduced-thickness region has a positive curvature, either a dopant of the first conductivity type at or in excess of $1 \times 10^{20}$ atoms/cm$^{-3}$ or a dopant of the second conductivity type at or in excess of $1 \times 10^{20}$ atoms/cm$^{-3}$.

If the segments of the reduced-thickness regions where the curvature is positive are a dopant-containing, highly conductive layer, the conductive semiconductor layers exhibit an electric-field-passivation effect, which in turn prevents carrier lifetime from decreasing and thereby contributes to efficient collection of carriers by the electrodes.

The photovoltaic conversion device can hence exhibit further improved conversion efficiency.

Arrangement 5

The reduced-thickness region according to any one of arrangements 1 to 4 may have a thickness of greater than or equal to 1 nm in the segment thereof where the reduced-thickness region has a positive curvature.

If the segments of the reduced-thickness regions where the curvature is positive have a thickness of greater than or equal to 1 nm, there exists a conductive layer in the segments where the curvature is positive. Due to an electric-field-passivation effect of the conductor layer, carrier lifetime does not decrease, and carriers are thereby efficiently collected by the electrodes. The fill factor also improves, contributing to improvement of properties, over a structure in which the amorphous semiconductor strips are spaced apart. A good electric-field-passivation effect is also achieved.

The photovoltaic conversion device can hence exhibit further improved conversion efficiency.

Arrangement 6

The present invention, in another embodiment thereof, is directed to a photovoltaic module including a conductive section and a plurality of photovoltaic conversion devices. The conductive section includes a wiring sheet or a wire grid. The photovoltaic conversion devices are provided on the conductive section. Each photovoltaic conversion device may be a photovoltaic conversion device according to any one of arrangements 1 to 5.

The photovoltaic conversion device according to any one of a arrangements 1 to 5 can exhibit improved conversion efficiency. The photovoltaic module, since including these photovoltaic conversion devices, can also exhibit improved conversion efficiency.

Arrangement 7

The present invention, in a further embodiment thereof, is directed to a solar power generation system including a photovoltaic module array and a power converter. The photovoltaic module array includes a plurality of photovoltaic modules. The power converter is configured to convert DC power received from the photovoltaic module array to AC power. Each photovoltaic module may be a photovoltaic module according to arrangement 6.

The photovoltaic module according to arrangement 6 can exhibit improved conversion efficiency. The solar power generation system according to arrangement 7 can hence exhibit improved conversion efficiency.

Arrangement 8

The solar power generation system according to arrangement 7 may further include an electric power storage device configured to store electric power received from the power converter.

The solar power generation system according to arrangement 8 can store the electric power generated by the photovoltaic modules.

Arrangement 9

The present invention, in still another embodiment thereof, is directed to a solar power generation system including a plurality of solar power generation subsystems and a plurality of power converters. Each power converter is associated with a different one of the solar power generation subsystems. The solar power generation subsystems each include a plurality of module systems. The module systems each include a plurality of photovoltaic module arrays. The photovoltaic module arrays each include a plurality of photovoltaic modules. Each photovoltaic module may be a photovoltaic module according to arrangement 6.

The solar power generation system according to arrangement 9 has a larger scale than the solar power generation system according to arrangement 7, and can still exhibit improved conversion efficiency.

Arrangement 10

The solar power generation system according to arrangement 9 may further include a plurality of electric power storage devices, one for each one of the power converters.

The solar power generation system according to arrangement 10 can store the electric power generated by the solar power generation subsystems.

The embodiments and examples disclosed herein are for illustrative purposes only in every respect and provide no basis for restrictive interpretations. The scope of the present invention is defined only by the claims and never bound by the embodiments or examples. Those modifications and variations that may lead to equivalents of claimed elements are all included within the scope of the invention.

INDUSTRIAL APPLICABILITY

The present invention is applicable to photovoltaic conversion devices, photovoltaic modules, and solar power generation systems.

The invention claimed is:
1. A photovoltaic conversion device comprising:
a semiconductor substrate of a first conductivity type;
a first amorphous semiconductor section on one of faces of the semiconductor substrate, the first amorphous semiconductor section including at least one first amorphous semiconductor strip of the first conductivity type;
a second amorphous semiconductor section on the face, the second amorphous semiconductor section including at least one second amorphous semiconductor strip of a second conductivity type that differs from the first conductivity type, the first and second amorphous semiconductor strips being arranged alternately as viewed along an in-plane direction of the semiconductor substrate;
a plurality of first electrodes arranged spaced apart from each other on the first amorphous semiconductor section; and
a plurality of second electrodes arranged spaced apart from each other on the second amorphous semiconductor section,
wherein
the first and second amorphous semiconductor strips each have at least one reduced-thickness region where that first or second amorphous semiconductor strip has a reduced thickness, the reduced-thickness region being provided across the first and second amorphous semiconductor strips in a width direction thereof, and
the reduced-thickness region has no electrodes formed in a segment thereof where the reduced-thickness region has a positive curvature with respect to a length direction of the first and second amorphous semiconductor strips.

2. The photovoltaic conversion device according to claim 1, further comprising a passivation film between the semiconductor substrate and the first and second amorphous semiconductor sections.

3. The photovoltaic conversion device according to claim 2, wherein the passivation film contains intrinsic hydrogenated amorphous silicon.

4. The photovoltaic conversion device according to claim 1, wherein the reduced-thickness region contains in the segment either a dopant of the first conductivity type at or in excess of $1 \times 10^{20}$ atoms/cm$^{-3}$ or a dopant of the second conductivity type at or in excess of $1 \times 10^{20}$ atoms/cm$^{-3}$.

5. The photovoltaic conversion device according to claim 1, wherein the reduced-thickness region has a thickness of greater than or equal to 1 nm in the segment.

6. A photovoltaic module comprising:
a conductive section including a wiring sheet or a wire grid; and
a plurality of photovoltaic conversion devices each according to claim 1 on the conductive section.

7. A solar power generation system comprising:
a photovoltaic module array including a plurality of photovoltaic modules each according to claim 6; and
a power converter configured to convert DC power received from the photovoltaic module array to AC power.

8. A solar power generation system comprising:
a plurality of solar power generation subsystems; and
a plurality of power converters, one for each one of the solar power generation subsystems, wherein
the solar power generation subsystems each include a plurality of module systems,
the module systems each include a plurality of photovoltaic module arrays, and
the photovoltaic module arrays each include a plurality of photovoltaic modules each according to claim 6.

* * * * *